(12) United States Patent  
Wang

(10) Patent No.: US 7,910,968 B2
(45) Date of Patent: Mar. 22, 2011

(54) SEMICONDUCTOR DEVICE AND METHOD FOR MANUFACTURING THE SAME

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 355 days.

(21) Appl. No.: 11/957,711

(22) Filed: Dec. 17, 2007

(65) Prior Publication Data

US 2008/0105911 A1 May 8, 2008

Related U.S. Application Data

(63) Continuation of application No. PCT/JP2005/011143, filed on Jun. 17, 2005.

(51) Int. Cl.
*H01L 21/02* (2006.01)

(52) U.S. Cl. ........ 257/295; 257/296; 257/300; 257/306; 257/310; 257/E21.664; 438/3; 438/396

(58) Field of Classification Search .................. 257/295; 438/3
See application file for complete search history.

(56) References Cited

U.S. PATENT DOCUMENTS

| | | | |
|---|---|---|---|
| 6,717,198 B2 | 4/2004 | Yoshikawa | |
| 6,933,156 B2 * | 8/2005 | Wang et al. | 438/3 |
| 6,943,398 B2 * | 9/2005 | Ito et al. | 257/310 |
| 7,235,834 B2 * | 6/2007 | Fukada | 257/295 |
| 7,288,456 B2 | 10/2007 | Ito et al. | |
| 7,550,344 B2 | 6/2009 | Ito et al. | |
| 2004/0094791 A1 | 5/2004 | Ito et al. | |
| 2004/0166668 A1 | 8/2004 | Ito | |
| 2005/0002266 A1 | 1/2005 | Kanaya et al. | |
| 2005/0072998 A1 | 4/2005 | Miura et al. | |
| 2005/0239251 A1 | 10/2005 | Ito et al. | |
| 2005/0277208 A1 * | 12/2005 | Nakazawa et al. | 438/3 |
| 2005/0285173 A1 * | 12/2005 | Nagai et al. | 257/296 |
| 2007/0293007 A1 | 12/2007 | Ito et al. | |

FOREIGN PATENT DOCUMENTS

| | | |
|---|---|---|
| CN | 1617344 A | 5/2005 |
| JP | 09293869 A | 11/1997 |
| JP | 2001210798 A | 8/2001 |
| JP | 2003115545 A | 4/2003 |
| JP | 2003174145 A | 6/2003 |
| JP | 200495861 A | 3/2004 |
| JP | 2004282041 A | 10/2004 |
| JP | 2004303996 A | 10/2004 |
| JP | 2004349474 A | 12/2004 |
| JP | 2005116756 A | 4/2005 |
| JP | 2005129875 A | 5/2005 |

(Continued)

OTHER PUBLICATIONS

Chinese Office Action Dated May 8, 2009, issued in corresponding Chinese Patent Application No. 200580050171.

(Continued)

*Primary Examiner* — Kenneth A Parker
*Assistant Examiner* — Jose R Diaz
(74) *Attorney, Agent, or Firm* — Fujitsu Patent Center

(57) ABSTRACT

A ferroelectric capacitor (42) is formed over a semiconductor substrate (10), and thereafter, a barrier film (46) directly covering the ferroelectric capacitor (42) is formed. Then, an interlayer insulating film (48) is formed and flattened. Then, an inclined groove is formed in the interlayer insulating film (48), and a barrier film (50) is formed over the entire surface.

16 Claims, 16 Drawing Sheets

FOREIGN PATENT DOCUMENTS

| | | |
|---|---|---|
| JP | 2005166920 A | 6/2005 |
| KR | 2004-42869 A | 5/2004 |

OTHER PUBLICATIONS

Notification of Transmittal of Copies of Translation of the International Preliminary Report on Patentability (Form PCT/IB/338) of International Application No. PCT/JP2005/011143 mailed Jan. 3, 2008 with Forms PCT/IB/373 and English translation form PCT/ISA/237.

Korean Office Action dated Apr. 29, 2009 (mailed date), issued in corresponding Korean Patent Application No. 10-2007-7027352.

International Search Report of PCT/JP2005/011143, date of mailing Aug. 30, 2005.

* cited by examiner

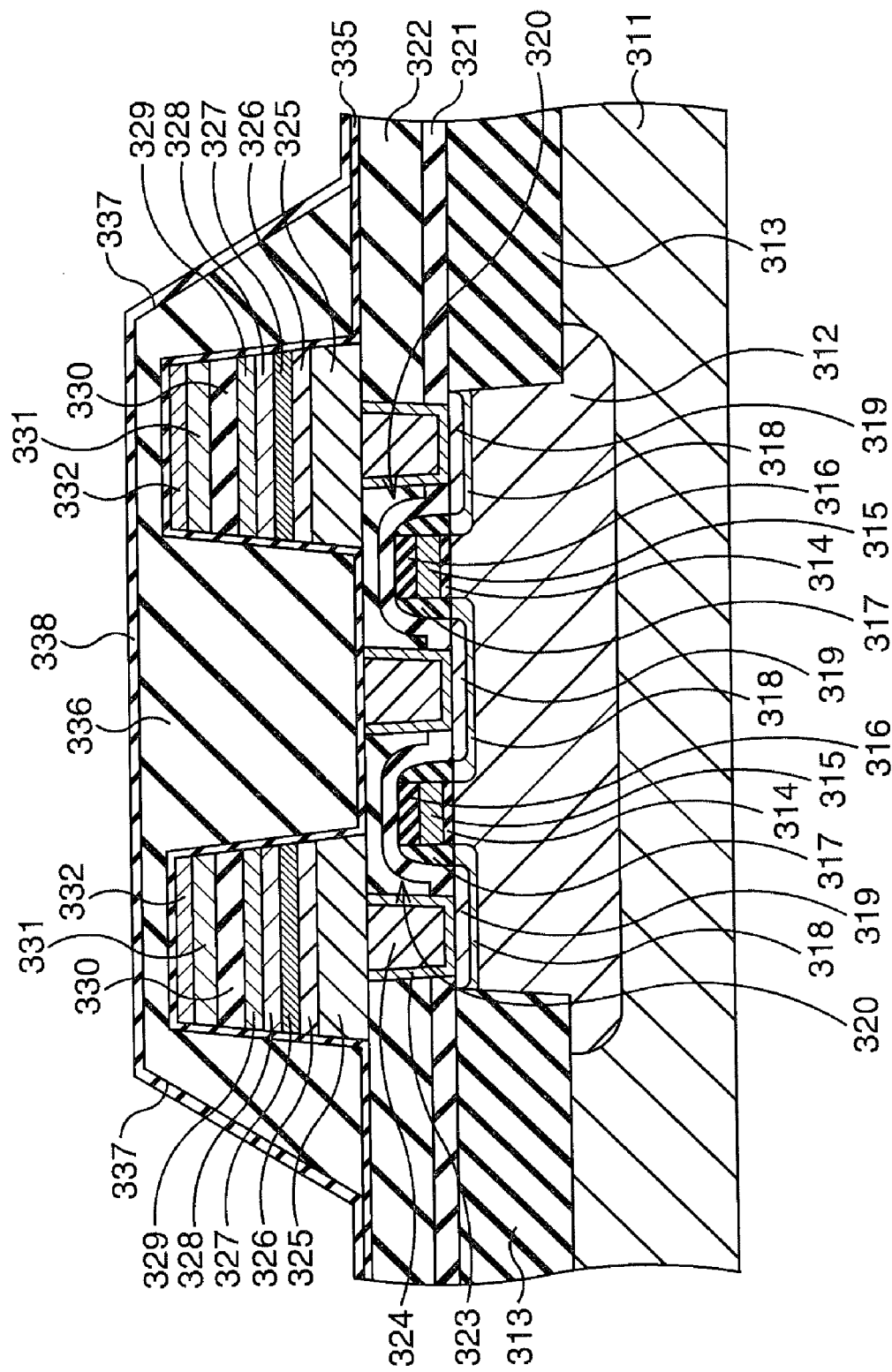

SEMICONDUCTOR DEVICE AND METHOD FOR MANUFACTURING THE SAME

BACKGROUND FIELD

The embodiments discussed herein are directed to a semiconductor device suitable for a nonvolatile memory including a ferroelectric capacitor, and a method for manufacturing the same.

DESCRIPTION OF RELATED ART

In recent years, with the advance of digital technology, there has been a growing trend to process or store large-volume data at a high speed. Therefore, high integration and high performance of semiconductor devices used for electronic equipment are in demand.

Thus, in order to realize high integration of a semiconductor memory device (DRAM), research and development are extensively conducted on the art of using a ferroelectric material or a high dielectric constant material as a capacitor insulating film of a capacitor element constituting a DRAM, instead of a silicon oxide or a silicon nitride.

In order to realize a nonvolatile RAM capable of a write operation and a read operation at low voltage at a high speed, research and development are also keenly conducted on a ferroelectric memory (FeRAM) using a ferroelectric film having a spontaneous polarization characteristic as a capacitor insulating film.

A ferroelectric memory stores information by using a hysteresis characteristic of a ferroelectric. In a ferroelectric memory, a ferroelectric capacitor having a ferroelectric film as a capacitor dielectric film between a pair of electrodes is provided at each memory cell. In a ferroelectric, polarization occurs in accordance with applied voltage between the electrodes, and even when the applied voltage is removed, spontaneous polarization remains. When the polarity of the applied voltage is inversed, the polarity of the spontaneous polarization is also inversed. Therefore, information can be read by detecting the spontaneous polarization. A ferroelectric memory has the characteristics of a high-speed operation, low power consumption, excellent durability of write and read, and the like.

However, on designing and manufacturing a ferroelectric memory, it is necessary to overcome the property that the electric characteristic of a ferroelectric capacitor is easily degraded by hydrogen gas and moisture entering from outside. When the substrate is heated to about 200° C. under an atmosphere with partial pressure of hydrogen of 40 Pa (0.3 Torr) in a conventional ferroelectric capacitor including a bottom electrode constituted of a Pt film, a ferroelectric film constituted of a $PbZr_{1-x}Ti_xO_3$(PZT) film, and a top electrode constituted of a Pt film, the ferroelectric characteristics of the $PbZr_{1-x}Ti_xO_3$(PZT) film are substantially lost. When thermal treatment is performed in a state in which a ferroelectric capacitor adsorbs moisture, or in a state in which moisture exist near the ferroelectric capacitor, the ferroelectric characteristics of the ferroelectric film are significantly degraded.

Thus, when manufacturing a ferroelectric memory, the treatment which generates as little moisture as possible and can be performed at a low temperature has been conventionally selected. Especially when an interlayer insulating film is formed, a CVD (Chemical Vapor Deposition) method or the like using a source gas which generates a relatively small amount of hydrogen is selected.

Further, a structure in which a barrier film which covers a ferroelectric capacitor is formed, and a structure in which a barrier film is formed above a ferroelectric capacitor are proposed. As the barrier film, an aluminum oxide film is mainly used. This is because an aluminum oxide film has the function of preventing diffusion of hydrogen and moisture.

However, even if a barrier film is provided, it is sometimes difficult to secure a sufficient hydrogen barrier property depending on the use environment or the like. Further, even if a moisture-proof ring is provided, it is difficult to secure a sufficient hydrogen barrier property.

Patent Document 1: Japanese Patent Application Laid-open No. 9-293869
Patent Document 2: Japanese Patent Application Laid-open No. 2003-115545
Patent Document 3: Japanese Patent Application Laid-open No. 2001-210798
Patent Document 4: Japanese Patent Application Laid-open No. 2003-174145

SUMMARY

It is an aspect of the embodiments discussed herein to provide a semiconductor device, including: a plurality of ferroelectric capacitors formed over a semiconductor substrate; a first barrier film directly covering the ferroelectric capacitor and preventing diffusion of hydrogen or water; an interlayer insulating film formed over the first barrier film; and a wiring formed on the interlayer insulating film and coupled to the ferroelectric capacitor, wherein the interlayer insulating film includes one or more second barrier films covering at least one of the plurality of ferroelectric capacitors from above and a side thereof, and preventing diffusion of hydrogen or water, and the one or more second barrier films cover the plurality of ferroelectric capacitors in common.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 6F is a sectional view showing the method for manufacturing a ferroelectric memory in sequence of process steps, following FIG. 6E.

DETAILED DESCRIPTION OF THE PREFERRED EMBODIMENTS

Figure 1:
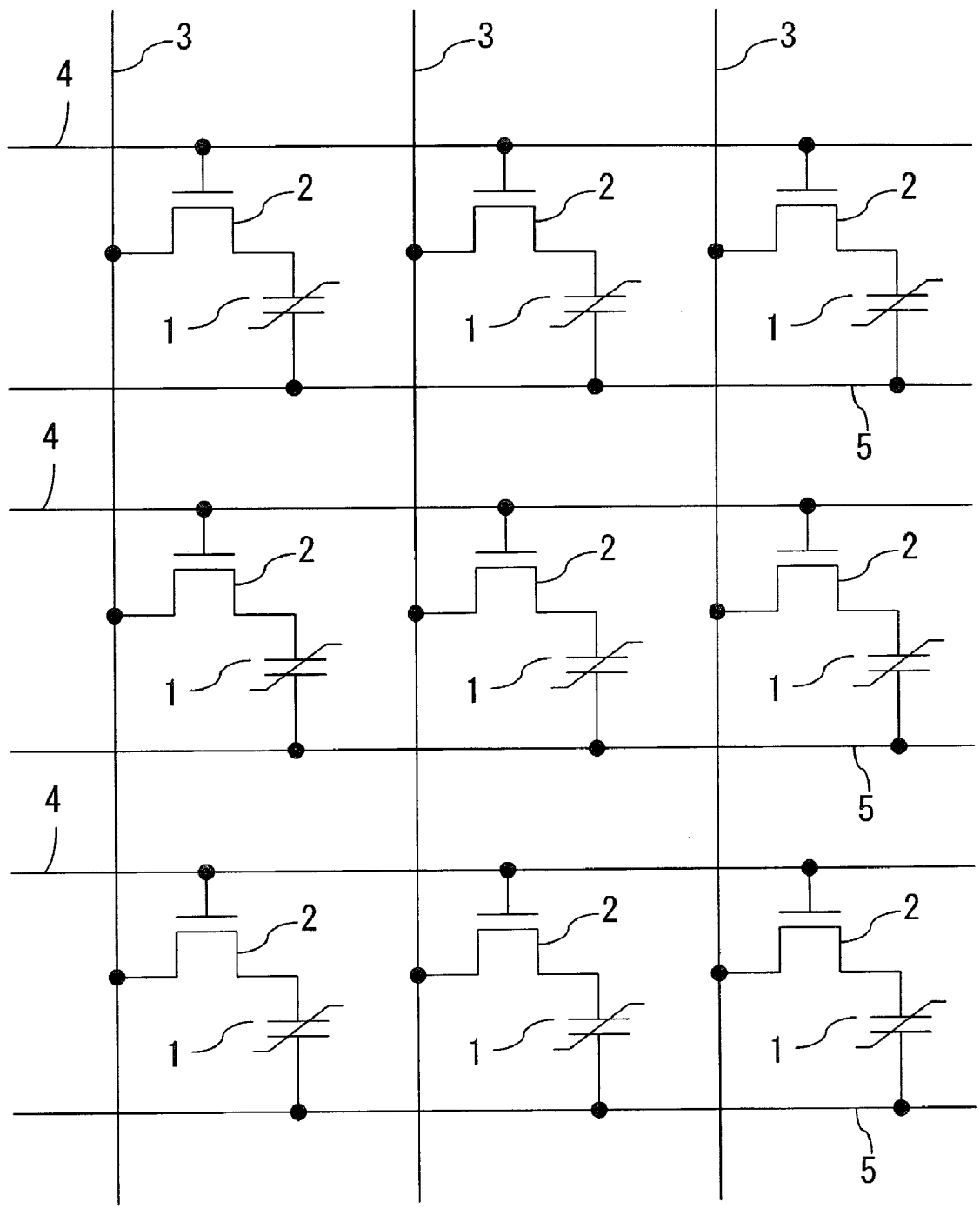
FIG. 1 is a circuit diagram showing a configuration of a memory cell array of a ferroelectric memory (semiconductor device) manufactured by a method according to an embodiment.

Hereinafter, embodiments will be described in concrete with reference to the accompanying drawings. FIG. 1 is a circuit diagram showing a configuration of a memory cell array of a ferroelectric memory (semiconductor device) manufactured by a method according to the embodiments.

The memory cell array is provided with a plurality of bit lines 3 extending in one direction, and a plurality of word lines 4 and plate lines 5 which extend in the direction perpendicular to the direction in which the bit lines 3 extend. A plurality of memory cells of a ferroelectric memory are disposed in an array form so as to conform to a lattice configured by the bit lines 3, word lines 4 and plate lines 5. Each of the memory cells is provided with a ferroelectric capacitor (storage part) 1 and a MOS transistor (switching part) 2.

A gate of the MOS transistor 2 is connected to the word line 4. One source/drain of the MOS transistor 2 is connected to the bit line 3, and the other source/drain is connected to one electrode of the ferroelectric capacitor 1. The other electrode of the ferroelectric capacitor 1 is connected to the plate line 5. Each of the word lines 4 and each of the plate lines 5 are shared by a plurality of MOS transistors 2 arranged in the same direction as the direction in which they extend. Similarly, each of the bit lines 3 is shared by a plurality of MOS transistors 2 arranged in the same direction as the direction in which it extends. The direction in which the word line 4 and the plate line 5 extend is sometimes called a row direction, and the direction in which the bit line 3 extends is sometimes called a column direction. However, the disposition of the bit line 3, the word line 4 and the plate line 5 are not limited to the above described one.

In the memory cell array of the ferroelectric memory thus configured, data is stored in accordance with the polarization state of the ferroelectric film provided in the ferroelectric capacitor 1.

First Embodiment

Next, a first embodiment will be described. Here, the cross-sectional structure of a semiconductor device will be described with a manufacturing method of it for convenience. FIGS. 2A to 2L are sectional views showing a method for manufacturing a ferroelectric memory (semiconductor device) according to the first embodiment in sequence of process steps.

Figure 2A:
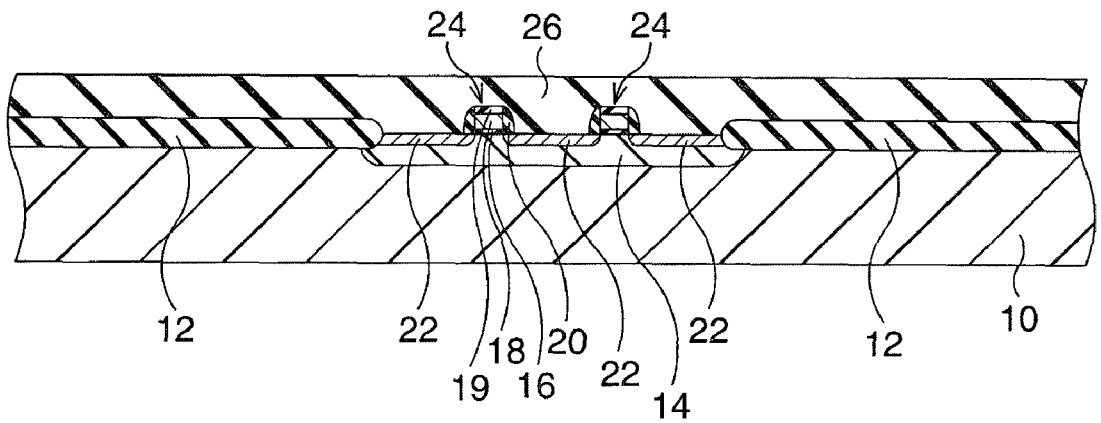
FIG. 2A is a sectional view showing a method for manufacturing a ferroelectric memory according to a first embodiment in sequence of process steps.

First, as shown in FIG. 2A, an element isolation region 12 which defines an element region is formed on a semiconductor substrate 10 such as a silicon substrate by, for example, an LOCOS (Local Oxidation of Silicon) method. Next, by introducing a dopant impurity by an ion implanting method, a well 14 is formed. Next, transistors 24 each including a gate insulating film 16, a gate electrode (gate wiring) 18, an insulating film 19, a side wall insulating film 20 and source/drain diffusion layers 22 are formed in the element region. The transistor 24 corresponds to the MOS transistor 2 in FIG. 1.

Next, an SiON film (silicon oxynitride film) of a thickness of 200 nm, for example, is formed on an entire surface by, for example, a plasma CVD (Chemical Vapor Deposition) method. Further, a silicon oxide film of a thickness of 600 nm, for example, is formed on the entire surface by a plasma TEOSCVD method. An interlayer insulating film 26 is constituted of the SiON film and the silicon oxide film. Next, the surface of the interlayer insulating film 26 is flattened by, for example, a CMP method.

Figure 2B:
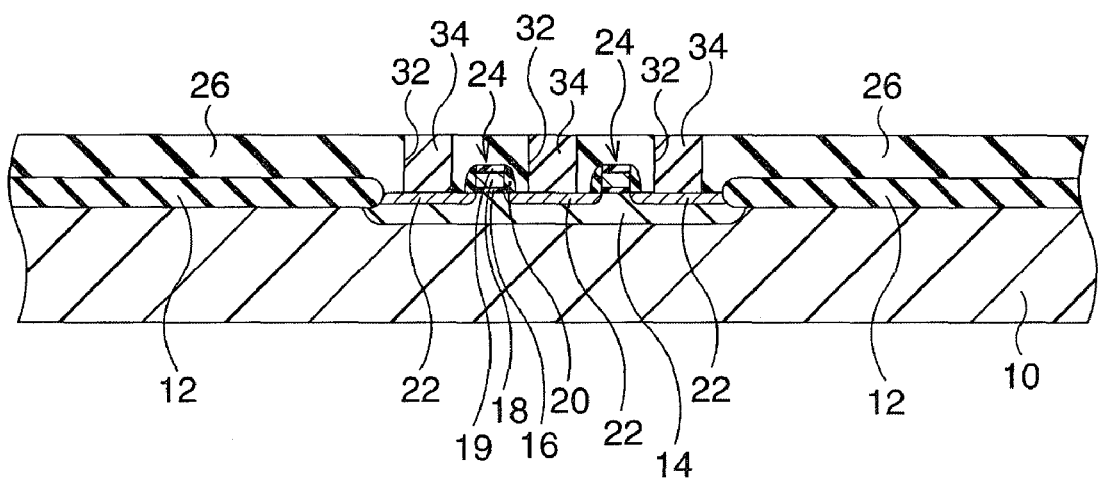
FIG. 2B is a sectional view showing the method for manufacturing a ferroelectric memory in sequence of process steps, following FIG. 2A.

Next, as shown in FIG. 2B, contact holes 32 reaching the source/drain diffusion layer 22, and contact holes (not shown) reaching the gate electrodes (gate wirings) 18 are formed in the interlayer insulating film 26 by using a photolithography technique. Next, a Ti film of a thickness of 20 nm to 60 nm is formed on the entire surface by, for example, a sputtering method. Thereafter, a TiN film of a thickness of 30 nm to 50 nm is formed by, for example, a sputtering method or a CVD method. A barrier metal film (not shown) is constituted of the Ti film and the TiN film.

Next, a tungsten film (not shown) of a thickness of 500 nm is formed on the entire surface by, for example, a CVD method. The tungsten film and the barrier metal film are polished by a CMP method until the surface of the interlayer insulating film 26 is exposed. As a result, conductive plugs 34 buried in the contact holes 32 and the like and containing tungsten are formed.

Figure 2C:
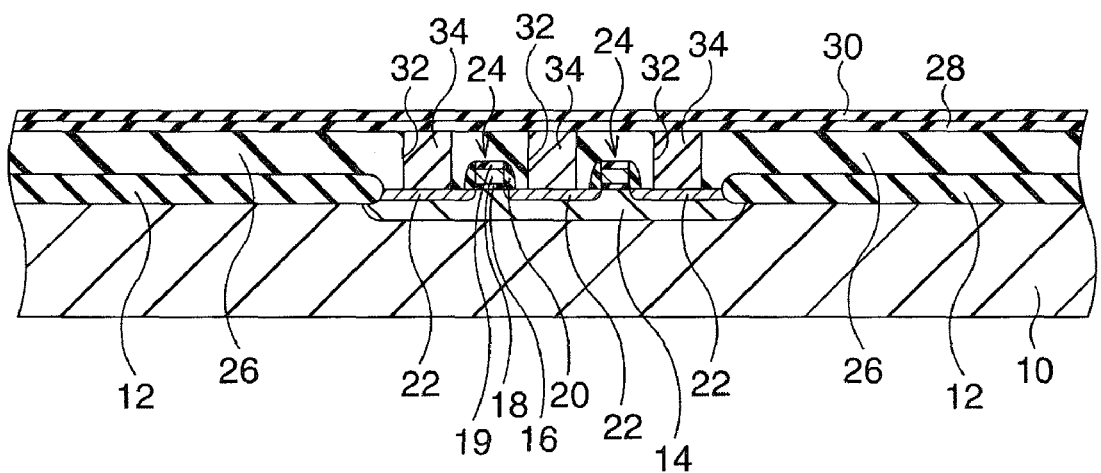
FIG. 2C is a sectional view showing the method for manufacturing a ferroelectric memory in sequence of process steps, following FIG. 2B.

Next, as shown in FIG. 2C, an oxidation preventing film 28 of a thickness of 100 nm is formed on the entire surface by, for example, a plasma CVD method. As the oxidation preventing film 28, for example, an SiON film or a silicon nitride film is formed. Next, a silicon oxide film 30 of a thickness of 130 nm is formed on the entire surface by, for example, a plasma TEOSCVD method. Subsequently, thermal treatment is performed in a nitrogen ($N_2$) atmosphere. For example, the thermal treatment temperature is set at 650° C. and the thermal treatment time is set at 30 minutes to 60 minutes.

Figure 2D:
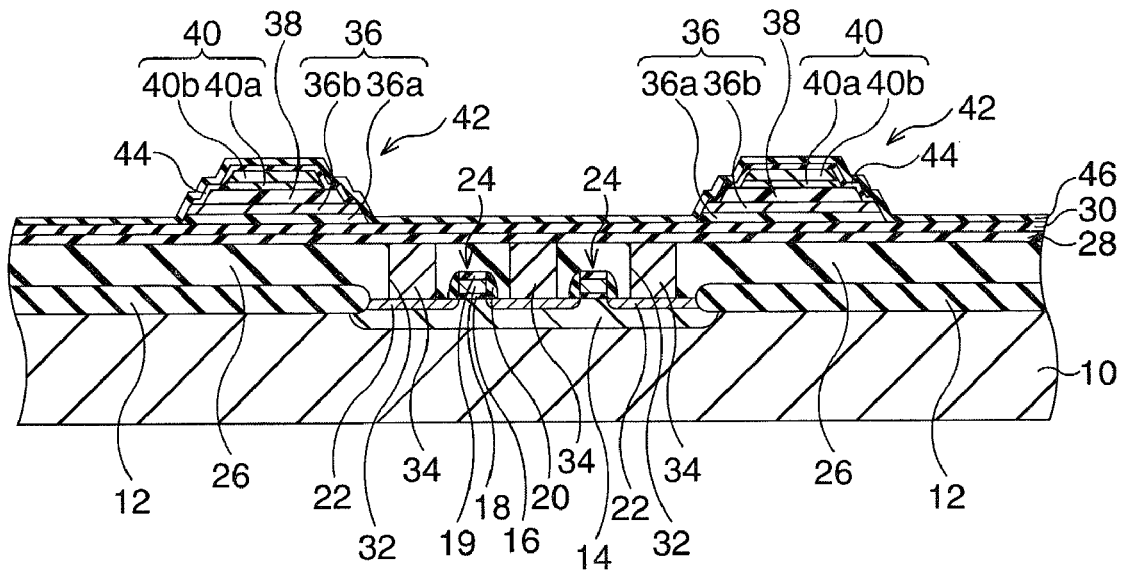
FIG. 2D is a sectional view showing the method for manufacturing a ferroelectric memory in sequence of process steps, following FIG. 2C.

Next, as shown in FIG. 2D, an aluminum oxide film 36a of a thickness of 20 nm to 100 nm is formed on the entire surface by, for example, a sputtering method or a CVD method. Further, a Pt film 36b of a thickness of 100 nm to 300 nm (for example, 175 nm) is formed on the entire surface as a bottom electrode film by, for example, a sputtering method. The aluminum oxide film 36a and the Pt film 36b constitute a stacked film 36.

Next, as also shown in FIG. 2D, a ferroelectric film 38 is formed on the entire surface by, for example, a sputtering method. As the ferroelectric film 38, a PZT film of a thickness of 100 nm to 250 nm (for example, 150 nm), for example, is formed. The method for forming the ferroelectric film 38 is not limited to a sputtering method. The ferroelectric film 38 may be formed by, for example, a sol-gel method, an MOD (Metal Organic Decomposition) method, an MOCVD method or the like.

Next, thermal treatment is performed under an oxygen atmosphere by, for example, an RTA (Rapid Thermal Annealing) method. The thermal treatment temperature is set at 650° C. to 800° C. (for example, 750° C.), and the thermal treatment time is set at 30 seconds to 120 seconds (for example, 60 seconds).

Next, as also shown in FIG. 2D, an $IrO_x$ film 40a of a thickness of 25 nm to 75 nm, for example, is formed by, for example, a sputtering method or an MOCVD method. Next, thermal treatment, for example, at 600° C. to 800° C. for 10 seconds to 100 seconds is performed under an argon and oxygen atmosphere. As a result, the ferroelectric material composing the ferroelectric film 38 is completely crystallized, and the interface between the ferroelectric film 38 and the $IrO_X$ film 40a becomes flat. Next, an $IrO_Y$ film 40b of a thickness of 150 nm to 250 nm, for example, is formed by, for example, a sputtering method or an MOCVD method. On this occasion, in order to suppress in-process degradation, a composition ratio Y of the oxygen of the $IrO_Y$ film 40b is made higher than a composition ratio X of the oxygen of the $IrO_X$ film 40a. The $IrO_X$ film 40a and the $IrO_Y$ film 40b constitute a top electrode film 40 of the ferroelectric capacitor.

The top electrode film may be made to have a three-layer structure. When the top electrode of a three-layer structure is formed, a first $IrO_X$ film of a thickness of 10 nm to 100 nm (for example, 50 nm) is formed by, for example, a sputtering method or an MOCVD method, and thereafter a second $IrO_Y$ film of a thickness of 100 nm to 300 nm is formed by, for example, a sputtering method or an MOCVD method. At this time, the composition ratio of the oxygen in the second $IrO_Y$ film is made higher than the composition ratio of the oxygen in the first $IrO_X$ film. Next, an Ir film of a thickness of 20 nm to 100 nm (for example, 75 nm) is formed by, for example, a sputtering method or an MOCVD method. The deposition temperature of the Ir film is set at, for example, 450° C. The Ir film has the functions of preventing the surfaces of the first $IrO_X$ film and the second $IrO_Y$ film from being reduced, and lowering the contact resistance with a conductive plug which will be formed later.

Next, a photoresist film (not shown) is formed on the entire surface by, for example, a spin coating method, and the photoresist film is patterned into a plane shape of a top electrode of the ferroelectric capacitor by photolithography. Subsequently, the top electrode film 40 is etched. As the etching gas, for example, Ar gas and $Cl_2$ gas are used. Thereafter, the photoresist film is removed. Next, thermal treatment at 400° C. to 700° C. (for example, 650° C.) for 30 minutes to 120 minutes (for example, 60 minutes) is performed under, for example, an oxygen atmosphere. The thermal treatment is for preventing occurrence of abnormality to the surface of the top electrode (patterned top electrode film 40).

Next, a photoresist film (not shown) is formed on the entire surface by, for example, a spin coating method, and the photoresist film is patterned into a plane shape of a capacitor insulating film by photolithography. Subsequently, the ferroelectric film is etched. Thereafter, the photoresist film is removed. Thereafter, the photoresist film is removed. Next, thermal treatment at 300° C. to 400° C. (for example, 350° C.) for 30 minutes to 120 minutes (for example, 60 minutes) is performed under an oxygen atmosphere.

Next, as also shown in FIG. 2D, a barrier film 44 is formed by, for example, a sputtering method or a CVD method. As the barrier film 44, an aluminum oxide film of a thickness of 20 nm to 150 nm, for example, is formed. The method for forming the aluminum oxide film is not limited to a sputtering method or a CVD method, but the methods other than an MOCVD method are preferably adopted. Next, thermal treatment at, for example, 400° C. to 600° C. for 30 minutes to 120 minutes is performed under an oxygen atmosphere.

Next, a photoresist film (not shown) is formed on the entire surface by, for example, a spin coating method, and the photoresist film is patterned into a plane shape of a bottom electrode of the ferroelectric capacitor by photolithography. Subsequently, the barrier film 44 and the bottom electrode film 36 are etched. As a result, the bottom electrode is formed. The patterned top electrode film 40, ferroelectric film 38 and bottom electrode film 36 constitute a ferroelectric capacitor 42, and the ferroelectric capacitor 42 corresponds to the ferroelectric capacitor 1 in FIG. 1. The barrier film 44 remains to cover the top electrode film 40 and the ferroelectric film 38. Thereafter, the photoresist film is removed. Next, thermal treatment at, for example, 350° C. to 600° C. for 30 minutes to 60 minutes is performed under an oxygen atmosphere.

Next, a barrier film 46 is formed on the entire surface by, for example, a sputtering method or a CVD method. As the barrier film 46, an aluminum oxide film of a thickness of 20 nm to 50 nm, for example, is formed. The entire ferroelectric capacitor 42 is covered with the barrier film 46.

After the formation of the barrier film 46, thermal treatment at, for example, 500° C. to 700° C. for 30 minutes to 120 minutes is performed under an oxygen atmosphere. As a result, oxygen is supplied to the ferroelectric film 38, and the electric characteristic of the ferroelectric capacitor 42 is recovered.

Figure 2E:
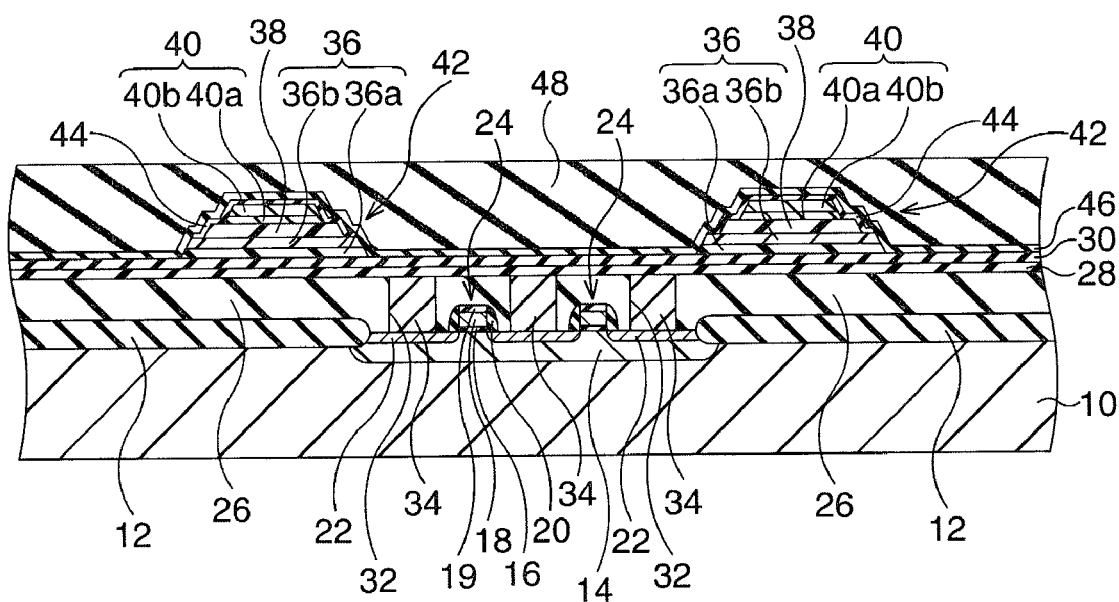
FIG. 2E is a sectional view showing the method for manufacturing a ferroelectric memory in sequence of process steps, following FIG. 2D.

Next, as shown in FIG. 2E, an interlayer insulating film 48 constituted of a silicon oxide of a thickness of 1500 nm, for example, is formed on the entire surface by, for example, a plasma TEOSCVD method. When a silicon oxide film is formed as the interlayer insulating film 48, a mixture gas of, for example, TEOS gas, oxygen gas and helium gas is used as a source gas. As the interlayer insulating film 48, for example, an inorganic film or the like having insulating properties may be formed. After the formation of the interlayer insulating film 48, the surface of the interlayer insulating film 48 is flattened by, for example, a CMP method.

Figure 2F:
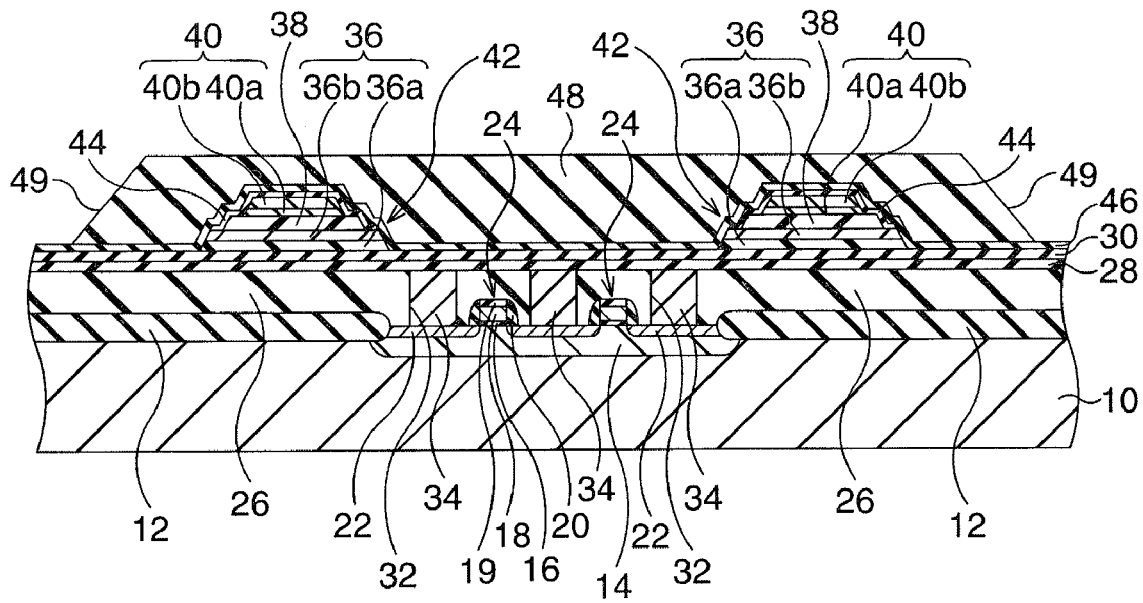
FIG. 2F is a sectional view showing the method for manufacturing a ferroelectric memory in sequence of process steps, following FIG. 2E.

Next, as shown in FIG. 2F, grooves 49 reaching the barrier film 46 are formed in the interlayer insulating film 48 by using a photolithography technique. As for the position of the groove 49, it may be located to surround all the ferroelectric capacitors 42, for example, disposed in an array form, or the grooves 49 each of which surrounds one or two or more of the ferroelectric capacitors 42 disposed in the array form may be formed at a plurality of spots.

Since in this embodiment, the aluminum oxide film is formed as the barrier film 46, the barrier film 46 can be used as the etching stopper film when the grooves 49 is formed. When such an aluminum oxide film is not formed, the oxidation preventing film 28 may be used as the etching stopper film.

Subsequently, in this embodiment, side walls of the grooves 49 are inclined subsequently to the formation of the grooves 49 as shown in FIG. 2F. In this processing, etching using, for example, Ar gas is performed. The inclination angle of the side wall is preferably set at 60° or less.

Next, thermal treatment is performed under a plasma atmosphere which is generated by using $N_2O$ gas, $N_2$ gas or the like. As a result of the thermal treatment, moisture in the interlayer insulating film 48 is removed, the property of the interlayer insulating film 48 changes, and it becomes difficult for moisture to enter the interlayer insulating film 48. The substrate temperature in this thermal treatment is set at, for example 350° C. The flow rate of the $N_2O$ gas is set at, for example, 1000 sccm. The flow rate of the $N_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr). After the thermal treatment is performed, the interlayer insulating film 48 may be exposed to the plasma atmosphere generated by using $N_2O$ gas or the like. By the thermal treatment, the moisture existing in the interlayer insulating film 48 is removed. When the inter layer insulating film 48 is subsequently exposed to the plasma atmosphere generated by using $N_2O$ gas or the like, the property of the interlayer insulating film 48 changes, and it becomes difficult for moisture to entire the interlayer insulating film 48.

Figure 2G:
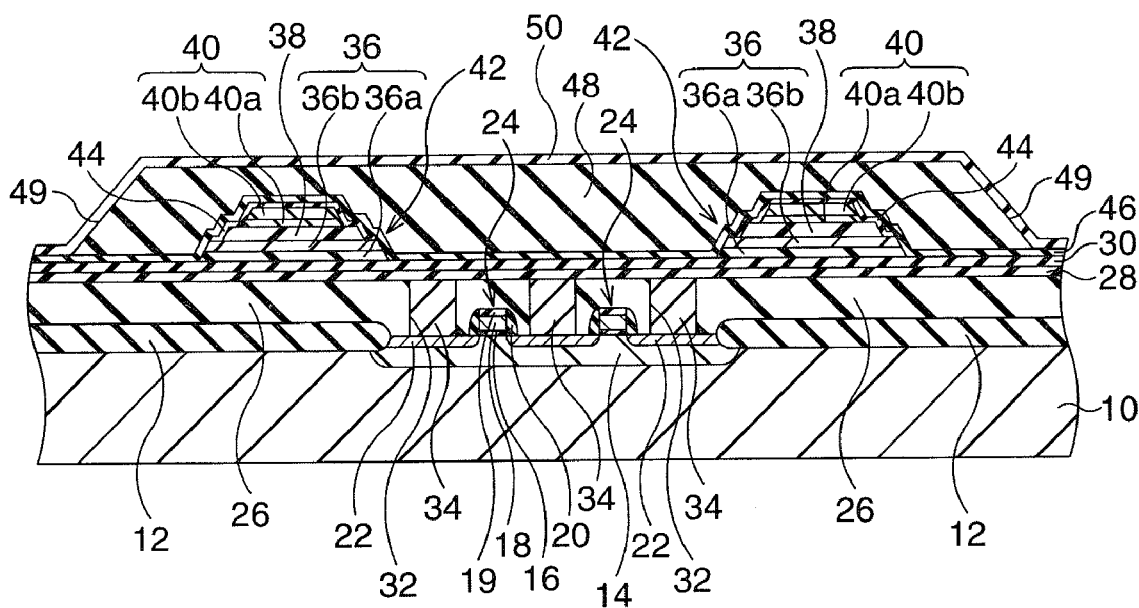
FIG. 2G is a sectional view showing the method for manufacturing a ferroelectric memory in sequence of process steps, following FIG. 2F.

Next, as shown in FIG. 2G, a barrier film 50 is formed on the entire surface by, for example, a sputtering method or a CVD method. As the barrier film 50, an aluminum oxide film of a thickness of 50 nm to 100 nm, for example, is formed. Above the ferroelectric capacitor 42, the barrier film 50 is formed on the flattened interlayer insulating film 48, and therefore, the barrier film 50 becomes flat. The barrier film 50 is also formed in the grooves 49. At this time, the side walls of the grooves 49 are inclined (for example, 60° or less), the barrier film 50 is formed substantially uniformly with favorable coverage.

Figure 2H:
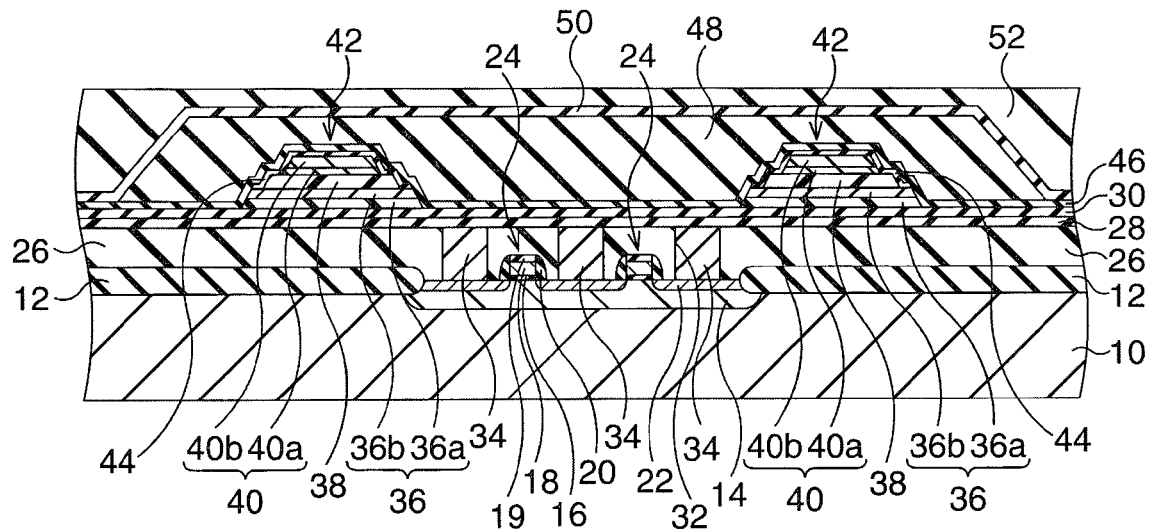
FIG. 2H is a sectional view showing the method for manufacturing a ferroelectric memory in sequence of process steps, following FIG. 2G.

Next, as shown in FIG. 2H, an interlayer insulating film 52 is formed on the entire surface by, for example, a plasma TEOSCVD method. As the interlayer insulating film 52, a silicon oxide film of a thickness of 800 nm to 1000 nm, for example, is formed. As the interlayer insulating film 52, an SiON film, a silicon nitride film or the like may be formed. Next, the surface of the interlayer insulating film 52 is flattened by, for example, a CMP method.

Figure 2I:
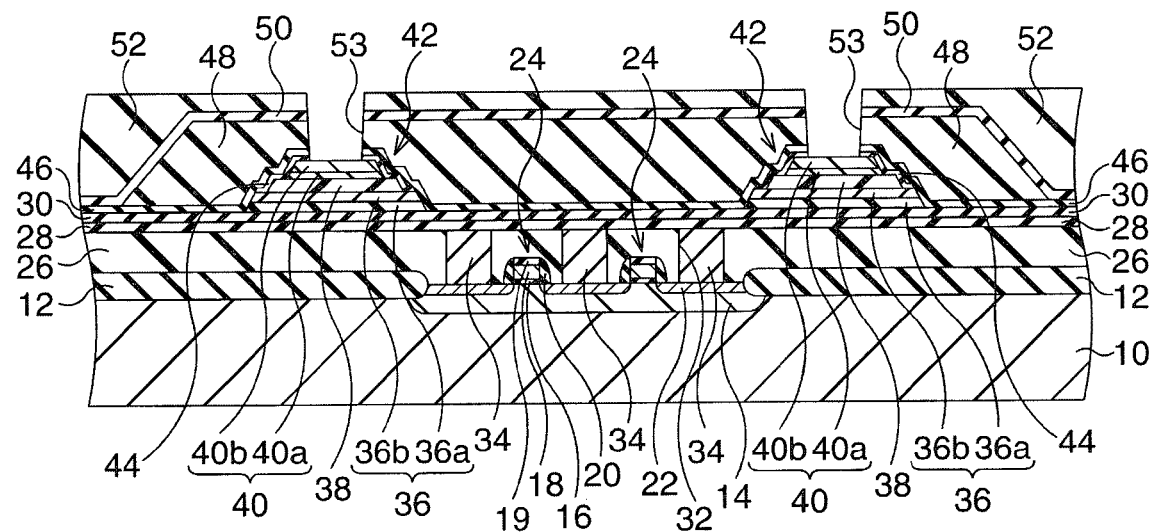
FIG. 2I is a sectional view showing the method for manufacturing a ferroelectric memory in sequence of process steps, following FIG. 2H.

Next, as shown in FIG. 2I, contact holes 53 reaching the top electrodes 40 of the ferroelectric capacitors 42, and contact holes (not shown) reaching the bottom electrodes 36 of the ferroelectric capacitors 42 are formed in the interlayer insulating film 52, the barrier film 50 and the interlayer insulating film 48 by using a photolithography technique.

Next, thermal treatment at 400° C. to 600° C. for 30 minutes to 120 minutes (60 minutes) is performed under an oxygen atmosphere. The substrate temperature is set at, for example, 500° C. to 600° C. As a result, oxygen is supplied to the ferroelectric films 38, and the electric characteristic of the ferroelectric capacitors 42 is recovered. The thermal treatment may be performed in an ozone atmosphere instead of the oxygen atmosphere. When the thermal treatment is performed in an ozone atmosphere, oxygen is also supplied to the ferroelectric films 38, and the electric characteristic of the ferroelectric capacitors 42 is recovered.

Figure 2J:
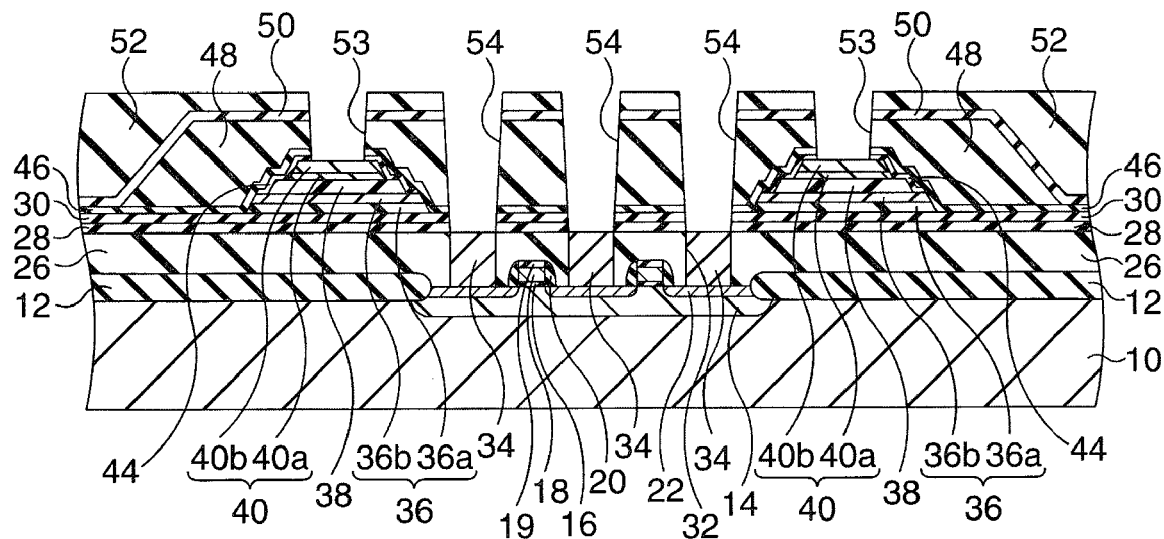
FIG. 2J is a sectional view showing the method for manufacturing a ferroelectric memory in sequence of process steps, following FIG. 2I.

Thereafter, as shown in FIG. 2J, contact holes 54 reaching the conductive plugs 34 are formed in the interlayer insulating film 52, the barrier film 50, the interlayer insulating film 48, the barrier film 46, the silicon oxide film 30 and the oxidation preventing film 28 by using a photolithography technique. Subsequently, plasma cleaning using Ar gas is performed. As a result, a natural oxide film and the like existing on the surface of the conductive plugs 34 are removed. As the condition of the plasma cleaning, such a condition that a thermal oxide film is removed by 10 nm, for example is adopted.

Figure 2K:
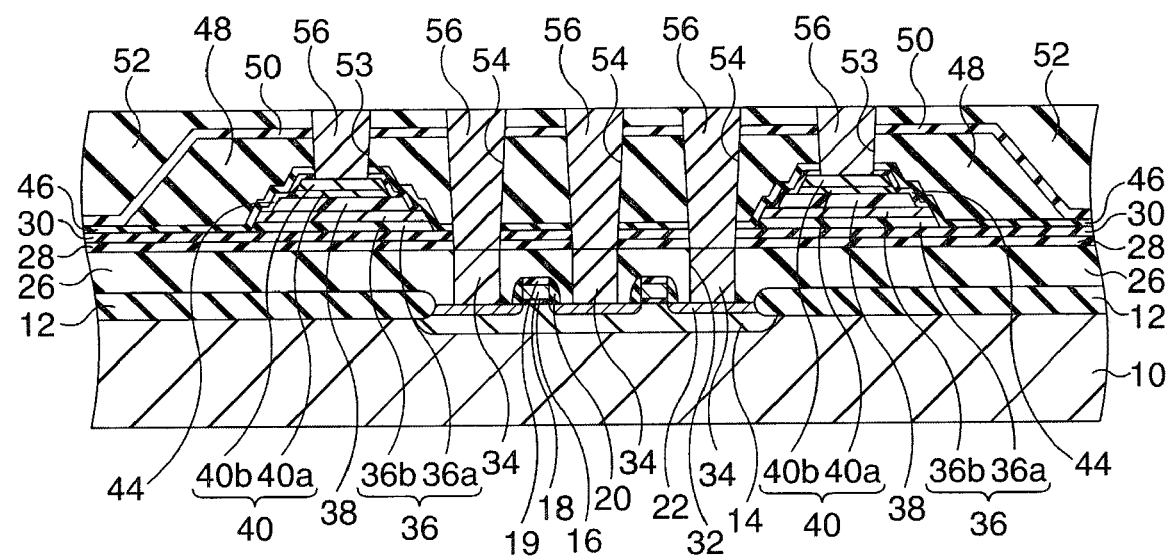
FIG. 2K is a sectional view showing the method for manufacturing a ferroelectric memory in sequence of process steps, following FIG. 2J.

Next, a TiN film (not shown) of a thickness of 20 nm to 100 nm is formed on the entire surface as a barrier metal film by, for example, a sputtering method. Next, a tungsten film (not shown) of a thickness of 300 nm to 600 nm is formed on the entire surface by, for example, a CVD method. Thereafter, the tungsten film and the barrier metal film are polished by, for example, a CMP method until the surface of the interlayer insulating film 52 is exposed. As a result, as shown in FIG. 2K, conductive plugs 56 which are buried in the contact holes 53, 54 and the like and contain tungsten are formed.

Next, thermal treatment is performed under a plasma atmosphere generated by using $N_2O$ gas, $N_2$ gas or the like. As a result of the thermal treatment, moisture which enters the interlayer insulating films 52 and 50 on the occasion of polishing the tungsten film and the like is removed, the property of the interlayer insulating film 52 changes, and it becomes difficult for moisture to enter the interlayer insulating film 52. By the thermal treatment, the surface of the interlayer insulating film 52 is nitrided, and an SiON film (not shown) is formed on the surface of the interlayer insulating film 52. The substrate temperature in the thermal treatment is set at, for example, 350° C. The flow rate of the $N_2O$ gas is set at, for example, 1000 sccm. The flow rate of the $N_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr). Subsequently, plasma cleaning using Ar gas is performed. As a result, natural oxide films and the like existing on the surfaces of the conductive plugs 56 are removed. As the condition of the plasma cleaning, such a condition that a thermal oxide film is removed by 10 nm, for example, is adopted.

Figure 2L:
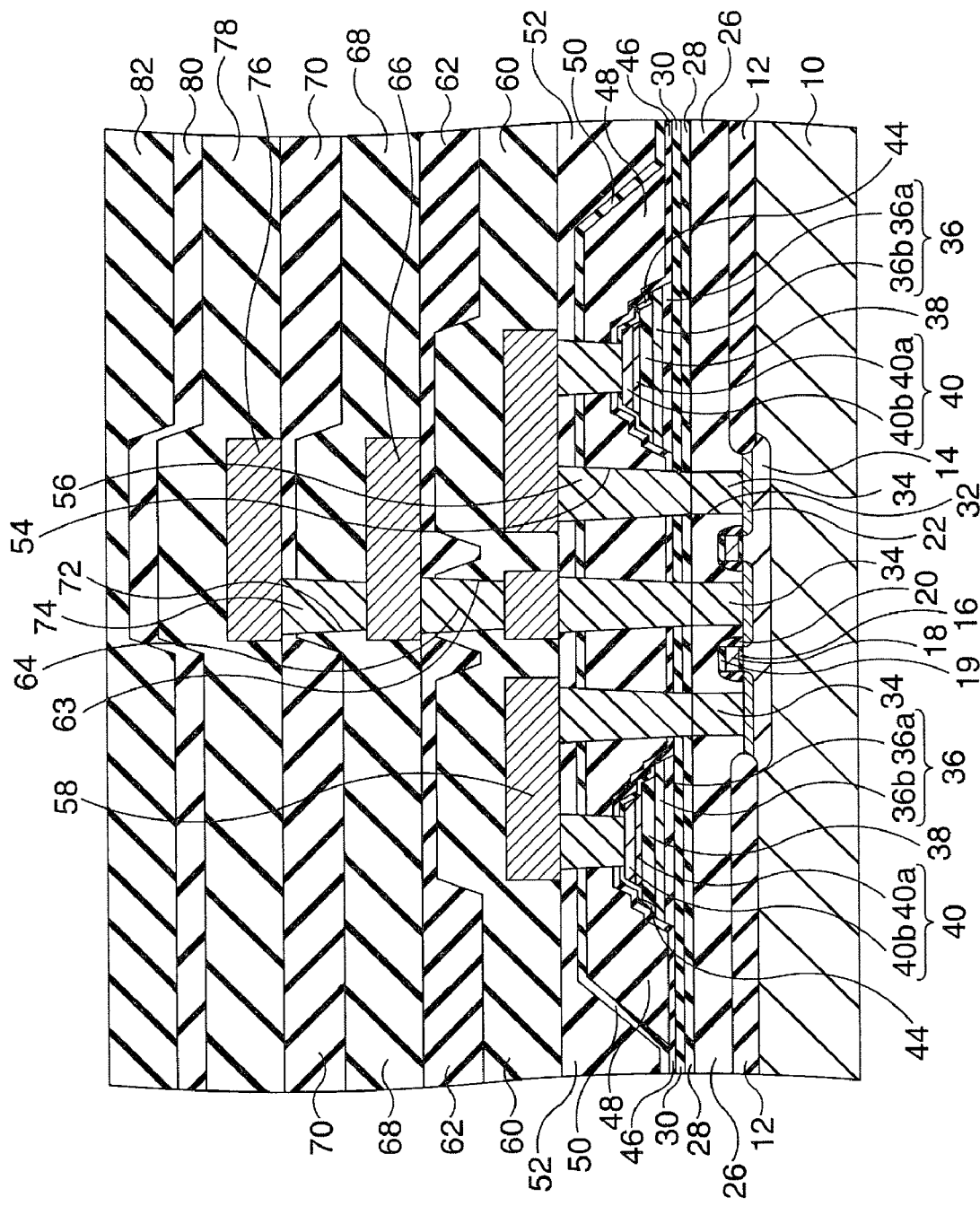
FIG. 2L is a sectional view showing the method for manufacturing a ferroelectric memory in sequence of process steps, following FIG. 2K.

Next, a Ti film of a thickness of 60 nm, a TiN film of a thickness of 30 nm, an AlCu alloy film of a thickness of 360 nm, a Ti film of a thickness of 5 nm, and a TiN film of a thickness of 70 nm (all of them are not shown) are formed in sequence by, for example, a sputtering method. As a result, a stacked film constituted of the Ti film, the TiN film, the AlCu alloy film, the Ti film and the TiN film is formed. Next, the stacked film is patterned by using a photolithography technique. As a result, as shown in FIG. 2L, a wiring (first metal wiring layer) 58 constituted of the stacked film is formed.

Next, a silicon oxide film 60 of a thickness of 750 mm is formed by, for example, a high density plasma enhanced CVD (Chemical Vapor Deposition) method. Next, a silicon oxide film 62 of a thickness of 1100 nm, for example, is formed by a plasma TEOSCVD method. As a source gas, mixture gas of, for example, TEOS gas, oxygen gas and helium gas is used. The methods for forming the silicon oxide films 60 and 62 are not limited to the above described ones. For example, both of the silicon oxide films 60 and 62 may be formed by a plasma TEOSCVD method.

Next, the surface of the silicon oxide film 62 is flattened by, for example, a CMP method. Subsequently, thermal treatment is performed under a plasma atmosphere generated by using N$_2$O gas and the like. As a result of the thermal treatment, moisture in the silicon oxide films 62 and 60 is removed, the properties of the silicon oxide films 62 and 60 change, and it becomes difficult for moisture to enter the silicon oxide films 62 and 60. The substrate temperature in the thermal treatment is set at, for example, 350° C.

Next, a contact hole 63 reaching the wiring 58 is formed in the silicon oxide films 62 and 60 by using a photolithography technique. Thereafter, plasma cleaning using Ar gas is performed. As a result, a natural oxide film and the like existing on the surface of the wiring 58 are removed. As the condition of the plasma cleaning, such a condition as to remove a thermal oxide film by 25 nm, for example, is adopted.

Next, a Ti film (not shown) of a thickness of 10 nm is formed by, for example, a sputtering method. Further, a TiN film (not shown) of a thickness of 3.5 µm to 7 µm is formed by, for example, an MOCVD method. The Ti film and the TiN film constitute a barrier metal film. Next, a tungsten film (not shown) of a thickness of 300 nm to 600 nm is formed by, for example, a CVD method.

Subsequently, the tungsten film and the barrier metal film are polished by, for example, a CMP method until the surface of the silicon oxide film 62 is exposed. As a result, a conductive plug 64 which is buried in the contact hole 63 and contains tungsten is formed.

Next, thermal treatment is performed under a plasma atmosphere generated by using N$_2$O gas, N$_2$ gas or the like. As a result of the thermal treatment, moisture which enters the silicon oxide films 62 and 60 on the occasion of polishing the tungsten film and the like is removed, the properties of the silicon oxide films 62 and 60 change, and it becomes difficult for moisture to enter the silicon oxide films 62 and 60. The substrate temperature in the thermal treatment is set at, for example, 350° C. The flow rate of the N$_2$O gas is set at, for example, 1000 sccm. The flow rate of the N$_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr).

Next, a Ti film of a thickness of 60 nm, a TiN film of a thickness of 30 nm, an AlCu alloy film of a thickness of 360 nm, a Ti film of a thickness of 5 nm, and a TiN film of a thickness of 70 nm (all of them are not shown) are formed in sequence by, for example, a sputtering method. As a result, a stacked film constituted of the Ti film, the TiN film, the AlCu alloy film, the Ti film and the TiN film is formed. Next, the stacked film is patterned by using a photolithography technique. As a result, a wiring (second metal wiring layer) 66 constituted of the stacked film is formed.

Next, a silicon oxide film 68 of a thickness of 750 mm is formed by, for example, a high density plasma CVD method. Next, a silicon oxide film 70 of a thickness of 1100 nm, for example, is formed by a plasma TEOSCVD method. The methods for forming the silicon oxide films 68 and 70 are not limited to the above described ones. For example, both of the silicon oxide films 68 and 70 may be formed by a plasma TEOSCVD method.

Next, the surface of the silicon oxide film 70 is flattened by, for example, a CMP method. Subsequently, thermal treatment is performed under a plasma atmosphere generated by using N$_2$O gas, N$_2$ gas or the like. As a result of the thermal treatment, moisture in the silicon oxide films 68 and 70 is removed, the properties of the silicon oxide films 68 and 70 change, and it becomes difficult for moisture to enter the silicon oxide films 68 and 70. The substrate temperature in the thermal treatment is set at, for example, 350° C. The flow rate of the N$_2$O gas is set at, for example, 1000 sccm. The flow rate of the N$_2$ gas is set at, for example, 285 sccm. The gap of the opposed electrodes is set at, for example, 7.62 mm (0.3 inches). The high frequency power which is applied is set at, for example, 525 W. The atmospheric pressure in the chamber is set at, for example, about 400 Pa (3 Torr).

Next, a contact hole 72 reaching the wiring 66 is formed in the silicon oxide films 68 and 70 by using a photolithography technique. Thereafter, plasma cleaning using Ar gas is performed. As a result, a natural oxide film and the like existing on the surface of the wiring 66 are removed. As the condition of the plasma cleaning, such a condition as to remove a thermal oxide film by 25 nm, for example, is adopted.

Next, a Ti film (not shown) of a thickness of 10 nm is formed by, for example, a sputtering method. Further, a TiN film (not shown) of a thickness of 3.5 µm to 7 µm is formed by, for example, an MOCVD method. The Ti film and the TiN film constitute a barrier metal film. Next, a tungsten film (not shown) of a thickness of 300 nm to 600 nm is formed by, for example, a CVD method.

Subsequently, the tungsten film and the barrier metal film are polished by, for example, a CMP method until the surface of the silicon oxide film 70 is exposed. As a result, a conductive plug 74 which is buried in the contact hole 72 and contains tungsten is formed.

Next, thermal treatment is performed under a plasma atmosphere generated by using N$_2$O gas, N$_2$ gas or the like. As a result of the thermal treatment, moisture which enters the silicon oxide films 70 and 68 on the occasion of polishing the tungsten film and the like is removed, the properties of the silicon oxide films 70 and 68 change, and it becomes difficult for moisture to enter the silicon oxide films 70 and 68. The substrate temperature in this thermal treatment is set at, for example, 350° C. The flow rate of the N$_2$O gas is set at, for example, 1000 sccm. The flow rate of the N$_2$ gas is set at, for example, 285 sccm.

Next, a Ti film of a thickness of 60 nm, a TiN film of a thickness of 30 nm, an AlCu alloy film of a thickness of 360 nm, a Ti film of a thickness of 5 nm, and a TiN film of a thickness of 70 nm (all of them are not shown) are formed in sequence by, for example, a sputtering method. As a result, a stacked film constituted of the Ti film, the TiN film, the AlCu alloy film, the Ti film and the TiN film is formed. Next, the stacked film is patterned by using a photolithography technique. As a result, a wiring (third metal wiring layer) 76 constituted of the stacked film is formed.

Next, a silicon oxide film 78 of a thickness of 700 mm is formed by, for example, a high density plasma enhanced CVD method. The method for forming the silicon oxide film 78 is not limited to the above described one. For example, the silicon oxide film 78 may be formed by a plasma TEOSCVD method.

Next, thermal treatment is performed under a plasma atmosphere generated by using N$_2$O gas, N$_2$ gas or the like. As a result of the thermal treatment, moisture in the silicon oxide film 78 is removed, the property of the silicon oxide film 78 changes, and it becomes difficult for moisture to enter the silicon oxide film 78. The substrate temperature in the thermal treatment is set at, for example, 350° C. The flow rate of the N$_2$O gas is set at, for example, 1000 sccm. The flow rate of the N$_2$ gas is set at, for example, 285 sccm.

Next, a silicon nitride film 80 of a thickness of 500 nm is formed on the silicon oxide film 78 by, for example, a CVD method. Entry of moisture is interrupted by the silicon nitride film 80, and the harmful effect that the wirings 76, 66, 58 and the like are corroded with moisture is prevented.

Next, an opening (not shown) reaching an electrode pad is formed in the silicon nitride film 80 and the silicon oxide film 78 by using a photolithograph technique. Thereafter, a polyimide film 82 of a thickness of 2 μm to 10 μm, for example, is formed by, for example, a spin coating method.

Next, an opening (not shown) reaching the electrode pad is formed in the polyimide film 82 by using a photolithography technique. The semiconductor device according to the present embodiment is thus completed.

In the semiconductor device thus manufactured, the barrier film 50 exists between the ferroelectric capacitor 42 and the wiring (first metal wiring layer) 58.

When a barrier film is formed on an interlayer insulating film having a level difference on the surface, the covering property of the barrier film is not favorable, and therefore, diffusion of hydrogen sometimes cannot be sufficiently prevented in the barrier film. If hydrogen reaches the dielectric film of the capacitor, a metal oxide constituting the dielectric film is reduced by the hydrogen, and the electric characteristic of the capacitor is degraded.

On the other hand, in this embodiment, the barrier film 50 is formed on the flattened interlayer insulating film 48, and therefore, the barrier film 50 is flat above the ferroelectric capacitor 42. The covering property of the flat barrier film 50 is extremely favorable, and therefore, the barrier film 50 can reliably barrier hydrogen. In addition, in this embodiment, the barrier film 50 is formed in a lower position from the wiring (first metal wiring layer) 58. Therefore, the harmful effect that hydrogen reaches the ferroelectric capacitor 42 when forming the silicon oxide films 60 and 62 and the like can be prevented by the barrier film 50. Therefore, according to this embodiment, the phenomenon that hydrogen reaches the ferroelectric film 38 can be reliably prevented, and the problem of the metal oxide constituting the ferroelectric film 38 being reduced by hydrogen can be prevented. Therefore, according to this embodiment, degradation of the electric characteristic of the ferroelectric capacitor 42 can be reliably prevented.

Further, in this embodiment, the ferroelectric capacitor 42 is indirectly surrounded from the sides by the barrier film 50. Therefore, hydrogen can be prevented from reaching the ferroelectric film 38 from the sides. Degradation of the characteristic in the ferroelectric capacitor 42 which is located at the outermost side among the ferroelectric capacitors 42 arranged in the array form can reliably prevented.

Further, in this embodiment, the interlayer insulation film 52 is formed on the barrier film 50, and the wiring 58 is formed on the interlayer insulating film 52. Accordingly, deterioration of the barrier film 50 is suppressed by the interlayer insulating film 52, and the function of the barrier film 50 can be sufficiently exhibited. The interlayer insulating film 52 is formed on the barrier film 50, and therefore, on the occasion of patterning for forming the wiring 58, the event that the barrier film 50 is also etched can be prevented. Further, as for the wiring 58, high reliability can be obtained.

Further, in this embodiment, the conductive plug 56 is not directly connected to the source/drain diffusion layer 14, but is connected to the source/drain diffusion layer 14 via the conductive plug 34.

If the conductive plug 56 is to be directly connected to the source/drain diffusion layer 14, a contact hole reaching the source/drain diffusion layer 14 needs to be formed by etching not only the interlayer insulating films 52 and 48 and the like but also the barrier film 50. However, the etching characteristic of the barrier film 50 of the aluminum oxide film or the like greatly differs from that of the interlayer insulating films 52 and 48 and the like, and therefore, it is extremely difficult to form such a contact hole without damaging the source/drain diffusion layer 14.

On the other hand, in this embodiment, the conductive plug 56 is connected to the source/drain diffusion layer 14 via the conductive plug 34, and therefore, the wiring 58 and the source/drain diffusion layer 14 can be electrically connected without damaging the source/drain diffusion layer 14. Therefore, according to this embodiment, a semiconductor device with high reliability can be manufactured with high yield.

Further, in this embodiment, the oxidation preventing film 28 is formed on the interlayer insulating film 26. Therefore, on the occasion of forming the silicon oxide film 30 and the like, oxidation of the surface of the conductive plug 34 can be prevented, and the contact resistance between the conductive plug 56 and the conductive plug 34 can be suppressed to be low.

Second Embodiment

Next, a second embodiment will be described.

Figure 3:
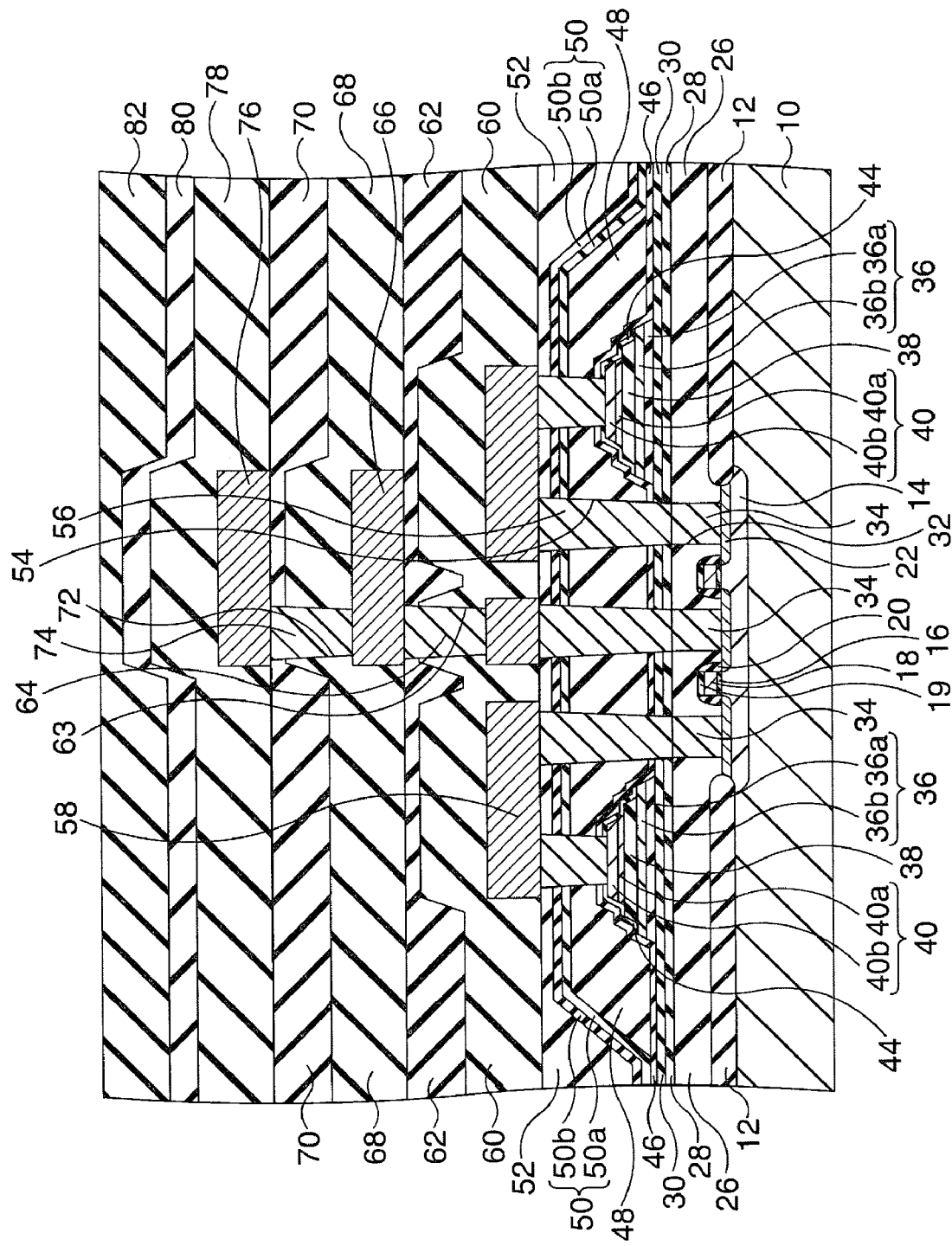
FIG. 3 is a sectional view showing a ferroelectric memory according to a second embodiment.

FIG. 3 is a sectional view showing a ferroelectric memory (semiconductor device) according to the second embodiment.

In the second embodiment, the barrier film 50 is constituted of an aluminum oxide film 50a and a titanium oxide film 50b. A thickness of the aluminum oxide film 50a is, for example, 20 nm to 50 nm, and a thickness of the titanium oxide film 50b is, for example, 20 nm to 100 nm. Instead of the titanium oxide film 50b, a silicon nitride film, a tantalum oxide film or the like may be formed.

For manufacturing the semiconductor device according to the second embodiment, a series of process steps up to and including the formation of the groove 49 are performed, and thereafter, the aluminum oxide film 50a and the titanium oxide film 50b are formed in sequence.

Thereafter, as in the first embodiment, the process steps from the formation of the interlayer insulating film 52 up to and including the formation of the pad opening are performed, and the semiconductor device is completed.

According to such a second embodiment, a higher hydrogen barrier property can be obtained. Namely, the problem of hydrogen reaching the ferroelectric film 38 can be more reliably prevented. Accordingly, yield can be more enhanced.

When the barrier film 50 is formed, the aluminum oxide film 50a may be formed on the titanium oxide film 50b after the titanium oxide film 50b is formed on the interlayer insulating film 48.

Third Embodiment

Figure 4:
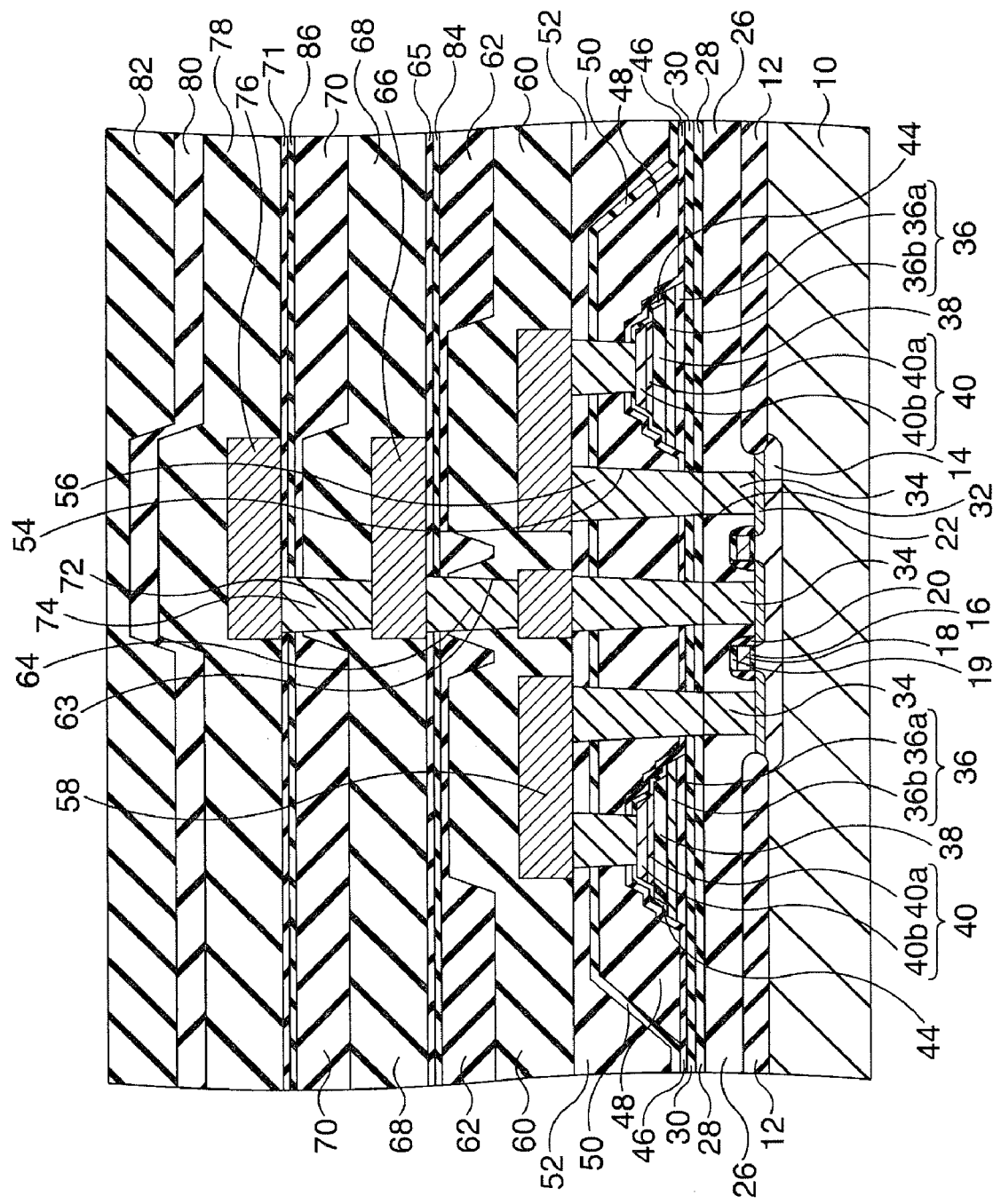
FIG. 4 is a sectional view showing a ferroelectric memory according to a third embodiment.

Next, a third embodiment will be described. FIG. 4 is a sectional view showing a ferroelectric memory (semiconductor device) according to the third embodiment.

In the third embodiment, a barrier film 84 is formed between the wiring (first metal wiring layer) 58 and the wiring (second metal wiring layer) 66, and a barrier film 86 is formed between the wiring (second metal wiring layer) 66 and a wiring (third metal wiring layer) 76. In other words, on the flattened silicon oxide film 62, the barrier film 84 and the silicon oxide film 65 are sequentially formed, and the wiring 66 is formed thereon. Further, on the flattened silicon oxide film 70, the barrier film 86 and the silicon oxide film 71 are sequentially formed, and the wiring 76 is formed thereon. The barrier films 84 and 86 are aluminum oxide films each of a thickness of 50 nm, for example. The thickness of each of the silicon oxide films 65 and 71 is, for example, 100 nm.

For manufacturing the semiconductor device according to the third embodiment, a series of process steps up to and including the flattening of the silicon oxide film 62 are performed as in the first embodiment, and thereafter, the barrier film 84 and the silicon oxide film 65 are sequentially formed. Thereafter, a series of process steps from the formation of the wiring 66 up to and including the flattening of the silicon oxide film 70 are performed. Next, the barrier film 86 and the silicon oxide film 71 are sequentially formed.

Thereafter, as in the first embodiment, the process steps from the formation of the wiring 76 up to and including the formation of the pad opening are performed, and the semiconductor device is completed.

According to such a third embodiment, a larger number of barrier films are formed, and therefore, a higher hydrogen barrier property can be obtained. Accordingly, yield can be enhanced more.

The barrier films 84 and 86 can be formed to surround the ferroelectric capacitor 42 as the barrier film 50. However, considering increase in the number of process steps, necessity of a deeper groove, the sufficient hydrogen barrier property by the barrier film 50 and the like, the barrier films 84 and 86 are preferably made flat films.

Fourth Embodiment

Figure 5:
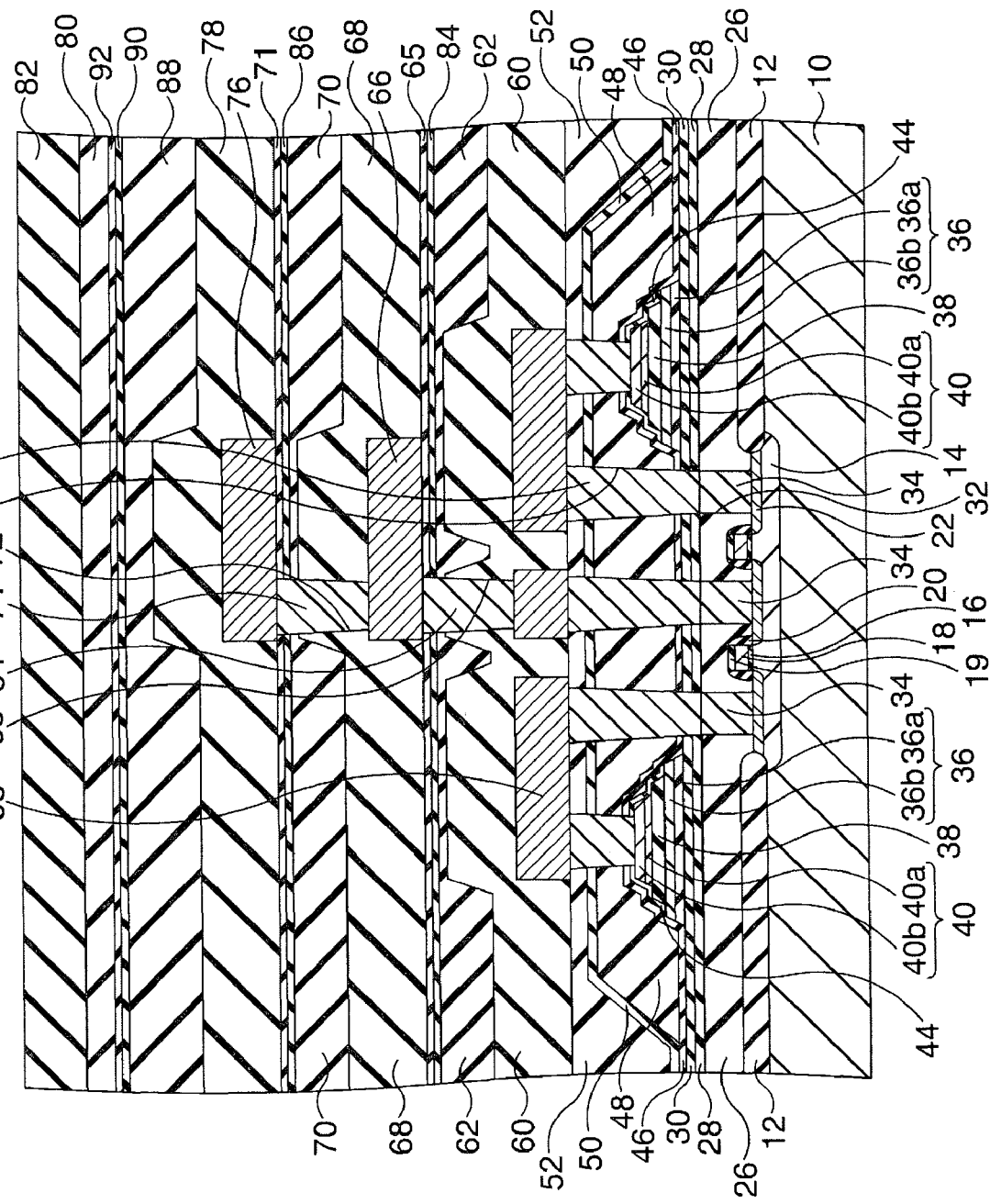
FIG. 5 is a sectional view showing a ferroelectric memory according to a fourth embodiment.

Next, a fourth embodiment will be described. FIG. 5 is a sectional view showing a ferroelectric memory (semiconductor device) according to the fourth embodiment.

In the fourth embodiment, a barrier film 90 is formed above the wiring (third metal wiring layer) 76, with respect to the third embodiment. Specifically, a flattened silicon oxide film 88 is formed on the silicon oxide film 78, and the barrier film 90 is formed on the silicon oxide film 88. Then, an insulating film 92 such as a silicon oxide film is formed on the barrier film 90, and the silicon nitride film 80 and the polyimide film 82 are formed on the insulating film 92 as in the first embodiment. The barrier film 90 is an aluminum oxide film of a thickness of about 50 nm, for example, and a thickness of the insulating film 92 is, for example, 100 nm.

For manufacturing the semiconductor device according to the fourth embodiment, a series of process steps up to and including the formation of the silicon oxide film 78 are performed as in the third embodiment, and thereafter, the silicon oxide film 88 of a thickness which at least fills a recess of the silicon oxide film 78 is formed. Next, the surface of the silicon oxide film 88 is flattened. Thereafter, the barrier film 90 and the insulating film 92 are sequentially formed on the silicon oxide film 88. Since the barrier film 90 is formed on the flattened silicon oxide film 88, the barrier film 90 becomes flat.

Thereafter, as in the third embodiment, the process steps from the formation of the silicon nitride film 80 up to and including the formation of the pad opening are performed, and the semiconductor device is completed.

According to such a fourth embodiment, the flat barrier film 90 is also formed above the wiring 76 on the uppermost layer, and therefore, a higher hydrogen barrier property can be obtained. Accordingly, the yield can be more enhanced.

Fifth Embodiment

Next, a fifth embodiment will be described. In each of the first to the fourth embodiments, the structure of the ferroelectric capacitor 42 is of a planar type, but in the fifth embodiment, a ferroelectric capacitor of a stacked structure is provided. Hereinafter, the fifth embodiment will be described in detail, and its sectional structure will be described with its manufacturing method for convenience. FIGS. 6A to 6G are sectional views showing a method for manufacturing a ferroelectric memory (semiconductor device) according to the fifth embodiment in sequence of process steps.

Figure 6A:
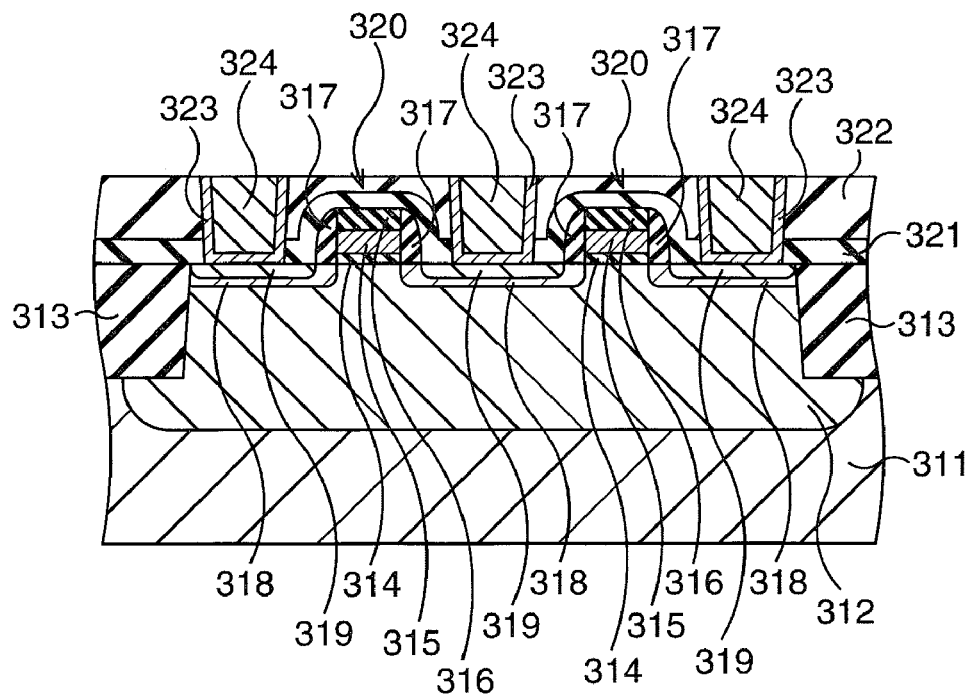
FIG. 6A is a sectional view showing a method for manufacturing a ferroelectric memory according to a fifth embodiment in sequence of process steps.

In this embodiment, as shown in FIG. 6A, a well 312 is first formed on a surface of a semiconductor substrate 311 such as a silicon substrate. An element isolation region 313 is formed on the surface of the semiconductor substrate 311 by, for example, STI (shallow trench isolation). Subsequently, a gate insulating film 314, a gate electrode 315, a cap film 316, a side wall 317, source/drain diffusion layers 318 and silicide layers 319 are formed on a surface of the well 312, and thereby, a MOS transistor 320 is formed as a switching element. The MOS transistor 320 corresponds to the MOS transistor 2 in FIG. 1. In each of the MOS transistors 320, two of the source/drain diffusion layers 318 are formed for a source and a drain, and one of them is shared by the two MOS transistors 320.

Next, a silicon oxynitride film 321 (thickness: 200 nm) is formed on the entire surface to cover the MOS transistors 320, a silicon oxide film 322 (thickness: 1000 nm) is further formed on the entire surface as an interlayer insulating film, and the silicon oxide film 322 is flattened by CMP (chemical mechanical polishing) or the like. The silicon oxynitride film 321 is formed to prevent hydrogen deterioration of the gate insulating film 314 and the like when the silicon oxide film 322 is formed. Thereafter, contact holes reaching the respective silicide layers 319 are formed in the silicon oxide film 322 and the silicon oxynitride film 321, and thereby, plug contact portions are opened. Subsequently, after a glue film 323 is formed in the contact holes, a W film is buried by, for example, a CVD method, and flattened by performing CMP, whereby conductive plugs 324 are formed.

Figure 6B:
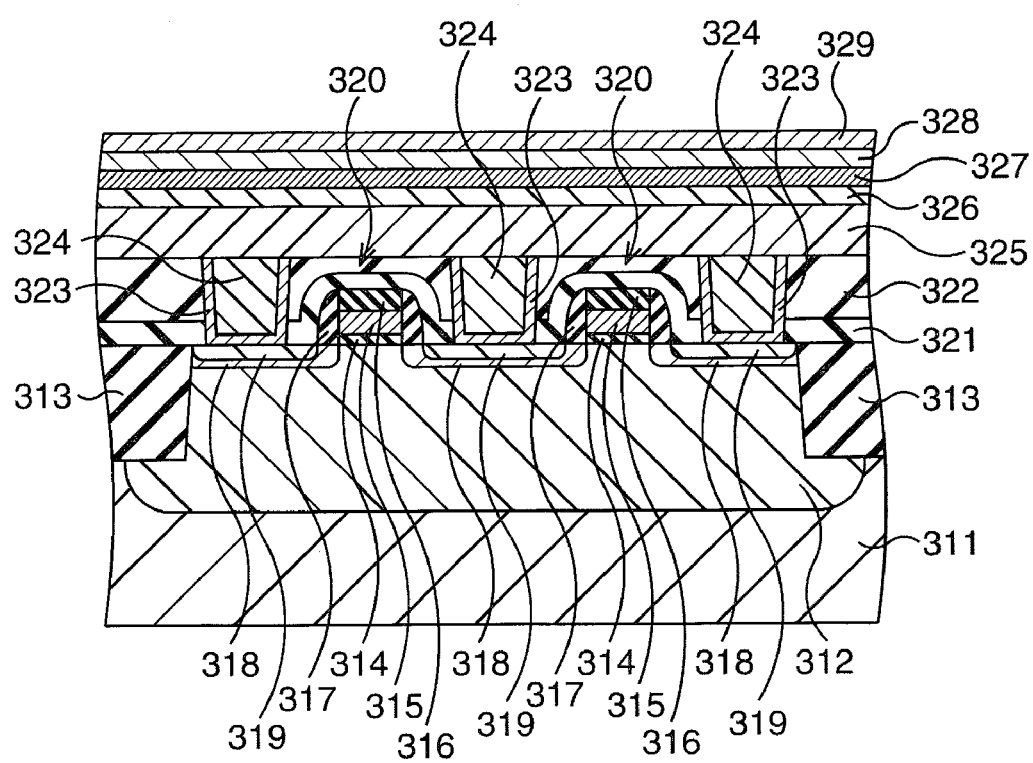
FIG. 6B is a sectional view showing the method for manufacturing a ferroelectric memory in sequence of process steps, following FIG. 6A.

Subsequently, as shown in FIG. 6B, an iridium film 325 is formed on the silicon oxide film 322 by, for example, a sputtering method. As the conditions at this time, for example, the substrate temperature is set at 500° C., the deposition power is set at 1 kW, the flow rate of Ar gas is set at 100 sccm, the pressure in the chamber is set at 0.35 Pa, and the deposition time is set at 176 seconds. As a result, the iridium film 325 of a thickness of about 250 nm is obtained.

Next, an iridium oxide film 326 is formed on the iridium film 325 by, for example, a sputtering method. As the conditions at this time, for example, the substrate temperature is set at 50° C., the deposition power is set at 1 kW, the flow rate of Ar gas is set at 60 sccm, the flow rate of $O_2$ gas is set at 60 sccm, the pressure in the chamber is set at 0.37 Pa, and the deposition time is set at 10 seconds. As a result, the iridium oxide film 326 of a thickness of about 28 nm is obtained.

Next, a platinum film 327 is formed on the iridium oxide film 326 by, for example, a sputtering method. As the conditions at this time, for example, the substrate temperature is set at 350° C., the deposition power is set at 1 kW, the flow rate of Ar gas is set at 100 sccm, the pressure in the chamber is set at 0.38 Pa, and the deposition time is set at 8 seconds. As a result, the platinum film 327 of a thickness of about 15 nm is obtained.

Thereafter, a platinum oxide film 328 is formed on the platinum film 327 by, for example, a sputtering method. As the conditions at this time, for example, the substrate temperature is set at 350° C., the deposition power is set at 1 kW, the flow rate of Ar gas is set at 36 sccm, the flow rate of $O_2$ gas is set at 144 sccm, the pressure in the chamber is set at 6.2 Pa, and the deposition time is set at 22 seconds. As a result, the platinum oxide film 328 of a thickness of about 25 nm is formed. Subsequently, a platinum film 329 is formed on the platinum oxide film 328 by, for example, a sputtering method.

As the conditions at this time, for example, the substrate temperature is set at 100° C., the deposition power is set at 1 kW, the flow rate of Ar gas is set at 100 sccm, the pressure in the chamber is set at 0.4 Pa, and the deposition time is set at 32 seconds. As a result, the platinum film 329 of a thickness of about 50 nm is formed.

The iridium film 325, iridium oxide film 326, platinum film 327, platinum oxide film 328 and platinum film 329 constitute a barrier metal film and a bottom electrode film. As the barrier metal film and the bottom electrode film, the following multi-layered bodies may be used. For example, (a) a multi-layered body in which a Ti film is formed on an Ir film, (b) a multi-layered body in which a Ti film and a TiAlN film are sequentially formed on an Ir film, (c) a multi-layered body in which a Ti film is formed on a Pt film, (d) a multi-layered body in which an $IrO_2$ film is formed on a Pt film, (e) a multi-layered body in which an $RuO_2$ film is formed on a Pt film, (f) a multi-layered body in which an LSCO($(La_{1-X}Sr_X)CuO_3$) film is formed on a Pt film, (g) a multi-layered body in which a Ti film and a TiAlN film are sequentially formed on a Pt film, and the like may be used. In other words, single films and stacked conductive films of metal or metal oxide including at least one kind selected from a group constituted of Pt, Ir, Ru, Rh, Re, Os, Pd, $SrRuO_3$ and TiAlN can be used.

Figure 6C:
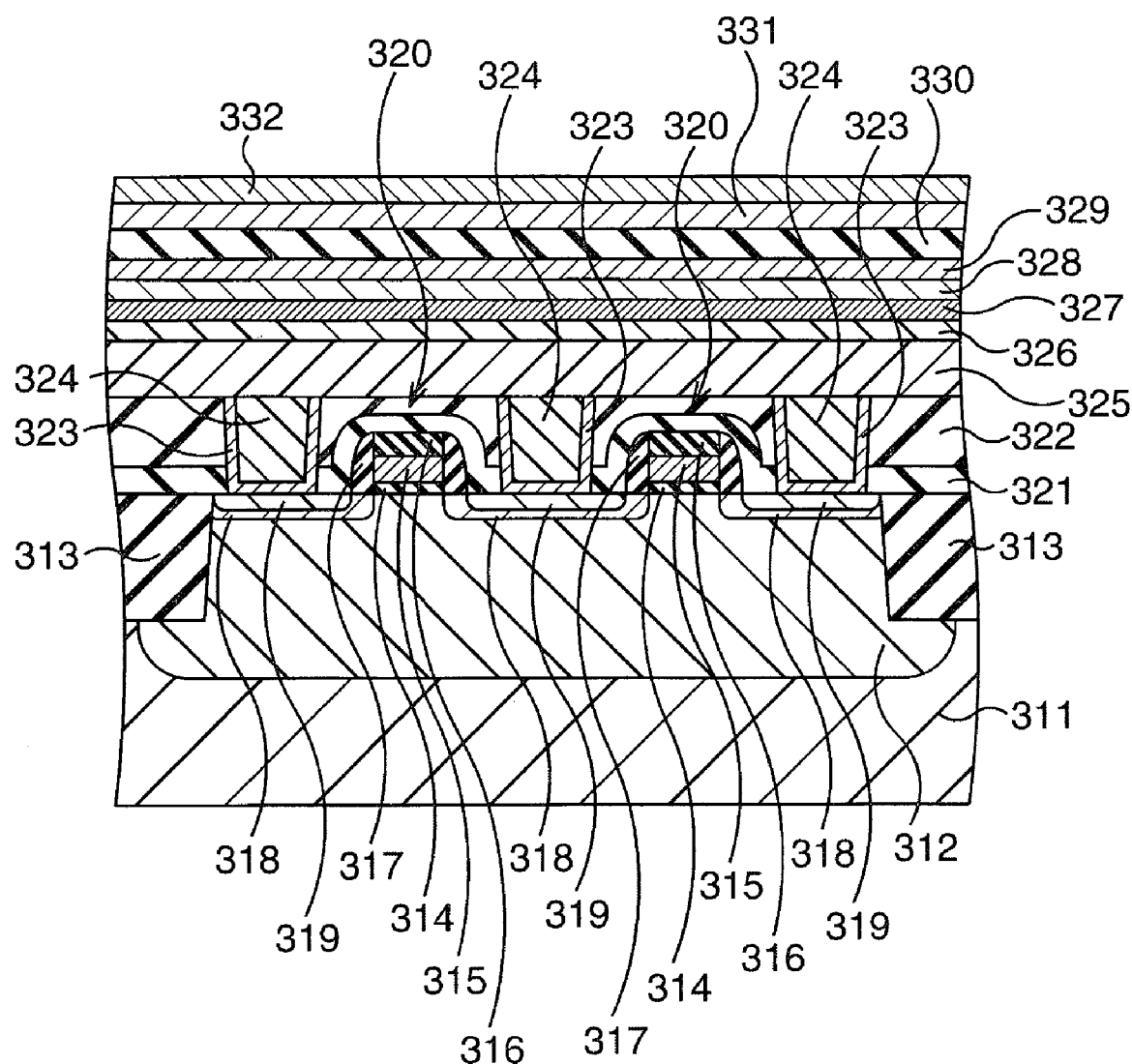
FIG. 6C is a sectional view showing the method for manufacturing a ferroelectric memory in sequence of process steps, following FIG. 6B.

After the above described multi-layered body is formed, the platinum film 329 is crystallized by performing rapid thermal annealing (RTA) at, for example, 750° C. under an Ar atmosphere for 60 seconds. Next, as shown in FIG. 6C, a ferroelectric film, for example, a PLZT($(Pb, La) (Zr, Ti)O_3$) film 330 is formed on the platinum film 329 by, for example, a sputtering method, and crystallization annealing for it is performed. The PLZT film 330 can be formed by, for example, an MOCVD method, and in the case of using the MOCVD method, the constitution of the bottom electrode film is desirably changed to another one.

After the crystallization annealing, a top electrode film 331 is formed on the PLZT film 330 by a sputtering method. The top electrode film 331 is constituted of two layers of iridium oxide films differing in composition from each other, for example. In formation of the iridium oxide film of the first layer, for example, the substrate temperature is set at a room temperature, the deposition power is set at 2 kW, the flow rate of Ar gas is set at 100 sccm, and the flow rate of $O_2$ gas is set at 59 sccm. The iridium oxide film of the first layer is grown to, for example, about 50 nm. After the iridium oxide film of the first layer is formed, annealing is performed, and thereafter, the iridium oxide film of the second layer is formed. The iridium oxide film of the second layer is grown to, for example, about 75 nm to 125 nm. Subsequently, cleaning of the rear surface (back surface) of the semiconductor substrate (wafer) 311 is performed.

Next, an iridium adhesive film (mask adhesive film) 332 is formed on the top electrode film 331 by, for example, a sputtering method. As the conditions at this time, for example, the substrate temperature is set at 400° C. or higher, the flow rate of Ar gas is set at 100 sccm, the deposition power is set at 1 kW, and the deposition time is set at 7 seconds. As a result, the iridium contact film 332 of a thickness of about 10 nm is formed. After the iridium contact film 332 is formed, a titanium nitride film (not shown) and a silicon oxide film (not shown) using TEOS which are used as a hard mask when the top electrode film 331, the PLZT film 330, the platinum film 329, the platinum oxide film 328, the platinum film 327, the iridium oxide film 326 and the iridium film 325 are patterned are formed in sequence. The titanium nitride film is formed at, for example, 200° C., and its thickness is about 200 nm. The silicon oxide film is formed at, for example, 390° C., and its thickness is about 390 nm.

Figure 6D:
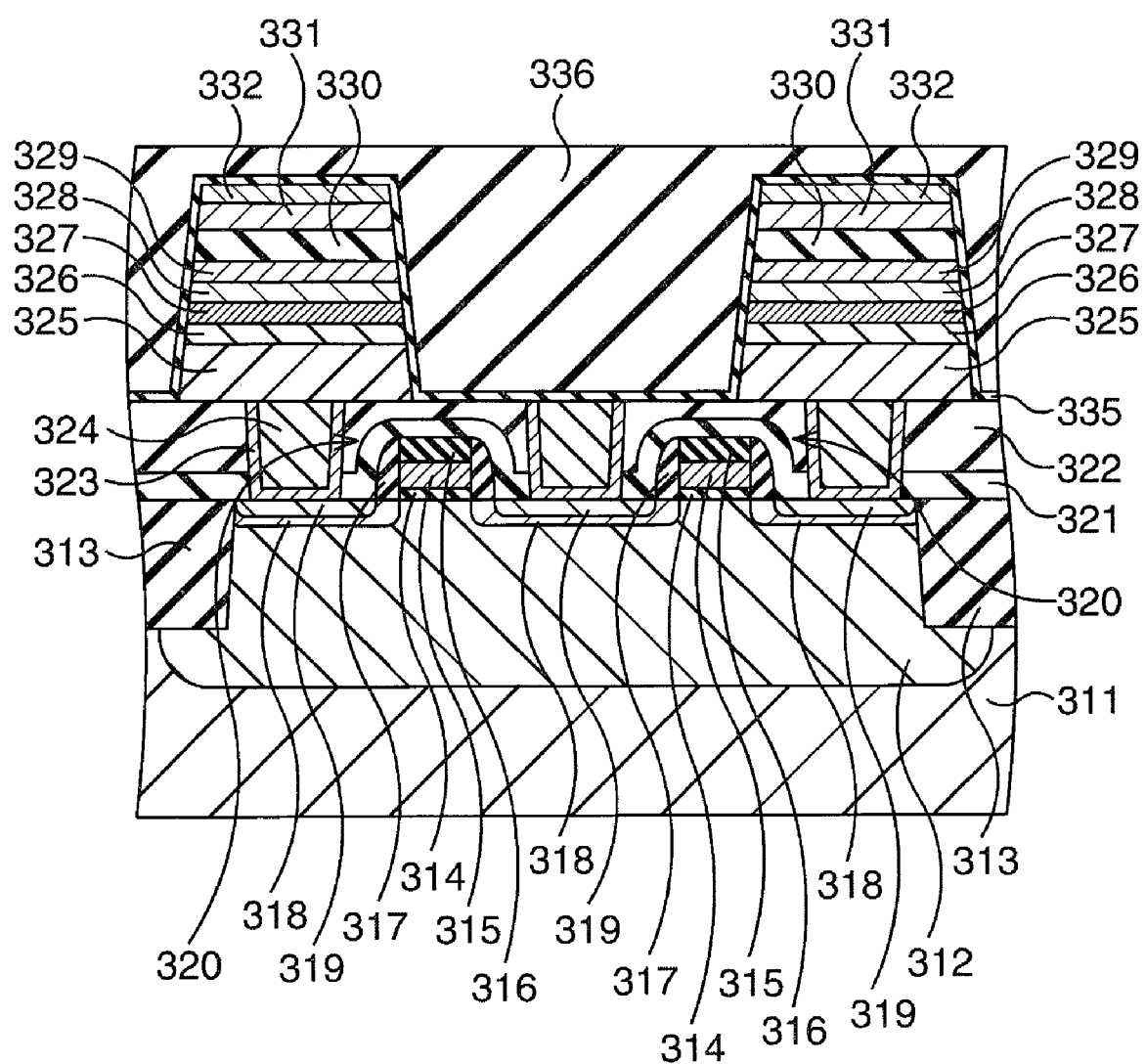
FIG. 6D is a sectional view showing the method for manufacturing a ferroelectric memory in sequence of process steps, following FIG. 6C.

Next, by patterning the silicon oxide film and the titanium nitride film, a hard mask is made to remain in only a region where a stacked type ferroelectric capacitor is to be formed. Next, by using a patterning and etching techniques using the silicon oxide film and the titanium nitride film as the hard mask, the iridium contact film 332, the top electrode film 331, the PLZT film 330, the platinum film 329, the platinum oxide film 328, the platinum film 327, the iridium oxide film 326 and the iridium film 325 are collectively processed, and thereby, the ferroelectric capacitor of a stacked structure is formed as shown in FIG. 6D. The ferroelectric capacitor corresponds to the ferroelectric capacitor 1 in FIG. 1. Thereafter, the hard mask (the silicon oxide film and the titanium nitride film) is removed. Subsequently, thermal treatment at, for example, 300° C. to 500° C. for 30 minutes to 120 minutes is performed in an oxygen atmosphere.

Next, a barrier film 335 is formed on the entire surface by, for example, a sputtering method or a CVD method. As the barrier film 335, an aluminum oxide film of a thickness of 20 nm is formed by, for example, a sputtering method or a CVD method. Subsequently, in order to repair damage to the PLZT film 330 by deposition, the etching process and the like, recovery annealing is performed. Thermal treatment at 500° C. to 700° C. for 30 minutes to 120 minutes is performed in, for example, an oxygen atmosphere.

Next, an interlayer insulating film 336 constituted of a silicon oxide of a thickness of 1500 nm, for example, is formed on the entire surface by, for example, a plasma TEOSCVD method. When a silicon oxide film is formed as the interlayer insulating film 336, a mixture gas of, for example, TEOS gas, oxygen gas and helium gas is used as a source gas. As the interlayer insulating film 336, for example, an inorganic film or the like having insulation properties may be formed. After the interlayer insulating film 336 is formed, the surface of the interlayer insulating film 336 is flattened by, for example, a CMP method.

Figure 6E:
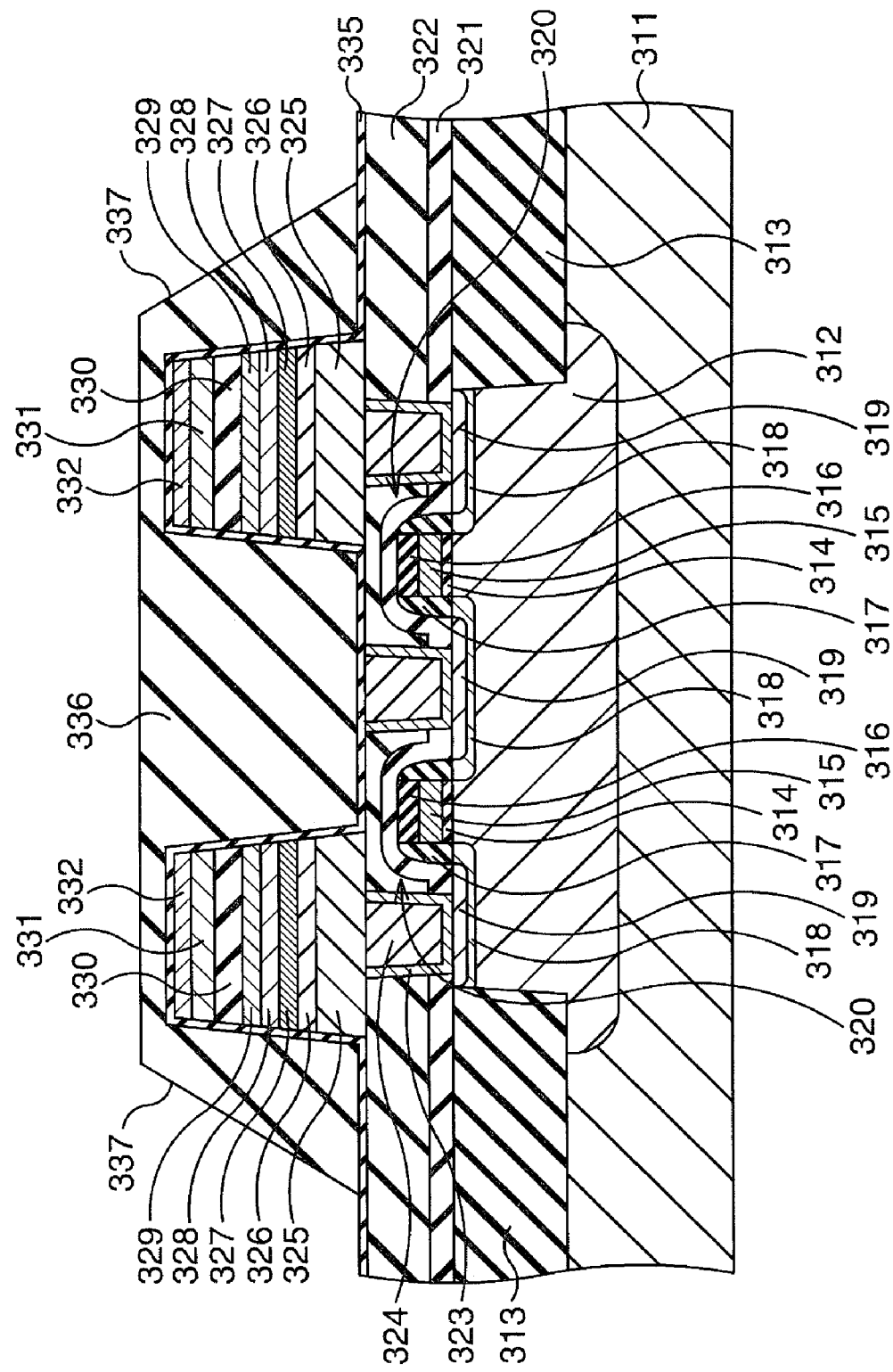
FIG. 6E is a sectional view showing the method for manufacturing a ferroelectric memory in sequence of process steps, following FIG. 6D.

Subsequently, as shown in FIG. 6E, a groove 337 reaching the barrier film 335 is formed in the interlayer insulating film 336 by using a photolithography technique. As the location of the groove 337, the groove 337 may surround all the ferroelectric capacitors disposed in the array form, for example, or the grooves 337 each of which surrounds one or more of the ferroelectric capacitors disposed in the array form may be formed at a plurality of spots.

Since the aluminum oxide film is formed as the barrier film 335 in this embodiment, the barrier film 335 can be used as the etching stopper film when the groove 337 is formed.

In this embodiment, as shown in FIG. 6E, following the formation of the groove 337, the side walls of the grooves 337 are inclined. On the occasion of the processing, for example, etching using Ar gas is performed. The inclined angle of the side wall is preferably set at 60° C. or less.

Next, thermal treatment is performed in a plasma atmosphere generated by using $N_2O$ gas, $N_2$ gas or the like. As a result of the thermal treatment, moisture in the interlayer insulating film 336 is removed, the property of the interlayer insulating film 336 changes, and it becomes difficult for moisture to enter in the interlayer insulating film 336.

Thereafter, as shown in FIG. 6F, a barrier film 338 is formed on the entire surface by, for example, a sputtering method or a CVD method. As the barrier film 338, an aluminum oxide film of a thickness of 50 nm to 100 nm, for example, is formed. Above the ferroelectric capacitor, the barrier film 338 is formed on the flattened interlayer insulating film 336, and therefore, the barrier film 338 becomes flat. The barrier film 338 is also formed in the grooves 337. At this time, the side walls of the groove 337s are inclined (for example, 60° or less) and therefore, the barrier film 338 is formed substantially uniformly with favorable coverage.

Figure 6G:
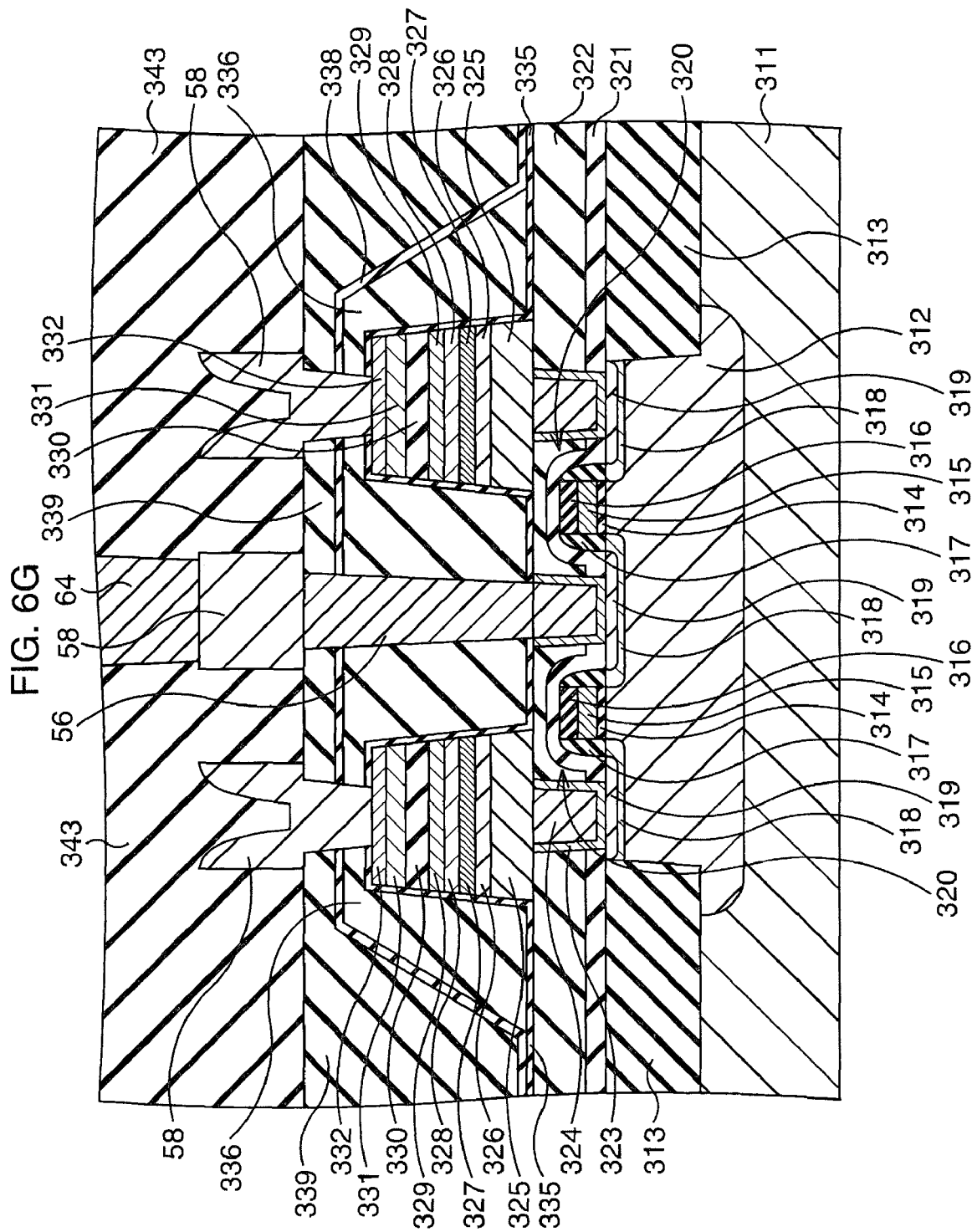
FIG. 6G is a sectional view showing the method for manufacturing a ferroelectric memory in sequence of process steps, following FIG. 6F.

Next, as shown in FIG. 6G, an interlayer insulating film 339 is formed on the entire surface by, for example, a plasma TEOSCVD method. As the interlayer insulating film 339, a silicon oxide film of a thickness of 800 nm to 1000 nm, for example, is formed. As the interlayer insulating film 339, an SiON film, a silicon nitride film or the like may be formed. Next, the surface of the interlayer insulating film 339 is flattened by, for example, a CMP method.

Thereafter, a contact hole reaching the conductive plug 324 is formed in the interlayer insulating film 339, the barrier film 338, the interlayer insulating film 336 and the barrier film 335 by using a patterning and etching techniques.

Thereafter, the conductive plug 56 and the wiring 58 are formed as the formation of the conductive plug 56 in the first embodiment. Subsequently, as in the second embodiment, the process steps from formation of the silicon oxide film 60 up to and including the formation of the pad opening are performed, and the semiconductor device is completed. The wiring 56 connected to the ferroelectric capacitor is connected to the plate line, and the wiring connected to the MOS transistor 320 via the conductive plug 56 is connected to the bit line.

In the embodiment applied to such a stacked type ferroelectric capacitor, a sufficient barrier effect can be obtained for hydrogen which enters from the sides as in the first embodiment and the like. Accordingly, the yield is enhanced and the service life under severer conditions is increased.

In the present embodiment, the barrier film is not limited to the aluminum oxide film and the titanium oxide film, but may be any film that can prevent diffusion of at least hydrogen or water such as a metal oxide film, a metal nitride film and the like. For example, an Al nitride film, an Al oxynitride film, a Ta oxide film, a Ta nitride film and a Zr oxide film, an Si oxynitride film and the like can be used. A metal oxide film is closely packed, and therefore, even when it is relatively thin, it can reliably prevent diffusion of hydrogen. Accordingly, from the viewpoint of microfabrication, a metal oxide is preferably used as the barrier film.

The crystal structure of the substance constituting the ferroelectric film is not limited to a perovskite structure, but may be, for example, a Bi layer structure. The composition of the substances composing the ferroelectric film is not specially limited. For example, as an acceptor element, Pb(lead), Sr(strontium), Ca (calcium), Bi(bismuth), Ba(barium), Li(lithium) and/or Y(yttrium) may be contained, and as a donor element, Ti(titanium), Zr(zirconium), Hf (hafnium), V(vanadium), Ta(tantalum), W(tungsten), Mn(manganese), Al(aluminum), Bi(bismuth) and/or Sr(strontium) may be contained.

As the chemical formula of the substance composing the ferroelectric film, for example, $Pb(Zr, Ti)O_3$, $(Pb, Ca)(Zr, Ti)O_3$, $(Pb, Ca)(Zr, Ti, Ta)O_3$, $(Pb, Ca)(Zr, Ti, W)O_3$, $(Pb, Sr)(Zr, Ti)O_3$, $(Pb, Sr)(Zr, Ti, W)O_3$, $(Pb, Sr)(Zr, Ti, Ta)O_3$, $(Pb, Ca, Sr)(Zr, Ti)O_3$, $(Pb, Ca, Sr)(Zr, Ti, W)O_3$, $(Pb, Ca, Sr)(Zr, Ti, Ta)O_3$, $SrBi_2(Ta_xNb_{1-x})_2O_8$, $SrBi_2Ta_2O_9$, $Bi_4Ti_2O_{12}$, $Bi_4Ti_3O_9$ and $BaBi_2Ta_2O_9$ are cited, but it is not limited to them. Si may be added to them.

Further, the present embodiment is not limited to the application to the ferroelectric memory, but, may be applied to, for example, a DRAM and the like. When it is applied to a DRAM, a high dielectric constant film such as, for example, a $(BaSr)TiO_3$ film (BST film), an $SrTiO_3$ film (STO film), and a $Ta_2O_5$ film may be used. The high dielectric constant film is a dielectric film which has a relative dielectric constant higher than silicon dioxide.

Further, the compositions of the top electrode and the bottom electrode are not specially limited. The bottom electrode may be composed of, for example, Pt (platinum), Ir (Iridium), Ru (ruthenium), Rh (rhodium), Re (rhenium), Os (osmium) and/or Pd (palladium), or it may be composed of an oxide of them. The top electrode may be composed of an oxide of, for example, Pt, Ir, Ru, Rh, Re, Os and/or Pd. The top electrode may be constituted by stacking a plurality of films.

Further, the structure of the cell of the ferroelectric memory is not limited to a 1T1C type, but it may be of a 2T2C type. In the ferroelectric memory, the ferroelectric capacitor itself may be constituted to be used as both a storage part and a switching part. In this case, the structure in which a ferroelectric capacitor is formed instead of a gate electrode of a MOS transistor is adopted. In other words, a ferroelectric capacitor is formed on a semiconductor substrate via a gate insulating film.

Further, a method for forming the ferroelectric capacitor is not specially limited. For example, a sol-gel method, a metallo-organic decomposition method (MOD), a CSD (Chemical Solution Deposition) method, a chemical vapor deposition (CVD) method, an epitaxial growth method, a sputtering method, a MOCVD (Metal Organic Chemical Vapor Deposition) method and the like can be adopted.

Patent Document 2 (Japanese Patent Application Laid-open No. 2003-115545) describes that after the capacitor is covered with a tantalum oxide film or the like, it is further covered with an aluminum oxide film. However, even if such a structure is adopted, it is difficult to sufficiently secure a barrier property against hydrogen entering from the sides.

Further, Patent Document 3 (Japanese Patent Application Laid-open No. 2001-210798) discloses that the capacitor is directly covered with a multi-layered body constituted of a silicon nitride film and an aluminum oxide film. However, even if such a structure is adopted, it is difficult to sufficiently secure a barrier property against hydrogen which enters from the sides.

Further, Patent Document 4 (Japanese Patent Application Laid-open No. 2003-174145) describes that the top electrode is shared by a plurality of ferroelectric capacitors arranged in the direction parallel with the direction in which the word line extends, the hydrogen barrier film which directly covers these ferroelectric capacitors is provided, a hydrogen barrier film is also provided among these ferroelectric capacitors, and gaps are provided among a plurality of ferroelectric capacitors arranged in the direction parallel with the direction in which the bit line extends. However, it is difficult to sufficiently secure a barrier property against hydrogen which enters from the sides. Especially in the ferroelectric capacitor located at the outermost side of the ferroelectric capacitors arranged in an array form, deterioration easily occurs. Further, since gaps need to be provided in the device, the process becomes complicated, and there is the possibility of reducing sufficient strength and property. Further, due to the influence of the hydrogen barrier film existing between the bottom electrodes, crystallinity of the ferroelectric film is reduced, and the ferroelectric film easily comes off.

INDUSTRIAL APPLICABILITY

As described above in detail, according to the present embodiment, entry of hydrogen or the like from the sides to the ferroelectric capacitor can be prevented. Therefore, yield can be enhanced. The service life can be elongated. Further, the operating temperature range can be enlarged.

What is claimed is:

1. A semiconductor device, comprising:
a plurality of ferroelectric capacitors formed over a semiconductor substrate, each of the ferroelectric capacitors comprising a bottom electrode, a ferroelectric film, and a top electrode;
a first barrier film directly covering side surfaces of the bottom electrode, the ferroelectric film, and the top electrode of the ferroelectric capacitor and preventing diffusion of hydrogen or water;
an interlayer insulating film formed over the first barrier film; and
a wiring formed on the interlayer insulating film and coupled to the ferroelectric capacitor, wherein
the interlayer insulating film includes one or more second barrier films covering at least one of the plurality of ferroelectric capacitors from above and a side thereof, and preventing diffusion of hydrogen or water,
the one or more second barrier films cover the plurality of ferroelectric capacitors in common,
the wiring is formed in a plurality of wiring layers, and
the semiconductor device further comprising a third barrier film formed in a position at a height of one or more of the wiring layers, and preventing diffusion of hydrogen or water, and an insulating film formed over an uppermost wiring layer located on an uppermost position of the plurality of wiring layers,
wherein a pad opening reaching the uppermost wiring layer is formed in the insulating film.

2. The semiconductor device according to claim 1, wherein the second barrier film has an inclined portion located between the plurality of ferroelectric capacitors, and
an angle formed by the inclined portion and a surface of the semiconductor substrate is 60° or less.

3. The semiconductor device according to claim 1, wherein the second barrier film has a flat portion located over the ferroelectric capacitors.

4. The semiconductor device according to claim 1, wherein the second barrier film is one kind selected from a group consisting of an aluminum oxide film, a titanium oxide film, a tantalum oxide film, a zirconium oxide film, an aluminum nitride film, a tantalum nitride film and an aluminum oxynitride film.

5. The semiconductor device according to claim 1, wherein the first barrier film is an aluminum oxide film.

6. The semiconductor device according to claim 1, wherein the second barrier film is separated from the first barrier film via at least another portion of the interlayer insulating film.

7. The semiconductor device according to claim 1, wherein the second barrier film is separated from the wiring via at least another portion of the interlayer insulating film.

8. The semiconductor device according to claim 1, wherein a thickness of each of the first and second barrier film is 1 nm to 100 nm.

9. The semiconductor device according to claim 1, wherein the second barrier film has at least two kinds of films constituted of substances differing from each other, and stacked on each other.

10. A method for manufacturing a semiconductor device, comprising:
forming a plurality of ferroelectric capacitors over a semiconductor substrate, each of the ferroelectric capacitors comprising a bottom electrode, a ferroelectric film, and a top electrode;
forming a first barrier film directly covering side surfaces of the bottom electrode, the ferroelectric film, and the top electrode of the ferroelectric capacitor and preventing diffusion of hydrogen or water;
forming an interlayer insulating film over the first barrier film; and
forming a wiring connected to the ferroelectric capacitor over the interlayer insulating film,
wherein forming the interlayer insulating film includes forming one or more second barrier films covering at least one of the plurality of ferroelectric capacitors from above and a side and preventing diffusion of hydrogen or water, and thereby causing the one or more second barrier films to cover the plurality of ferroelectric capacitors in common,
wherein forming the interlayer insulating film includes:
forming a first insulating film on the first barrier film;
flattening the first insulating film;
forming one or more grooves in the first insulating film so that all the plurality of ferroelectric capacitors are surrounded by the one or more grooves; and
forming the second barrier film on the insulating film and inside the grooves,
wherein the method further comprising performing thermal treatment in a plasma atmosphere generated by using at least N$_2$O (nitrogen monoxide) between the forming the grooves and the forming the second barrier film.

11. The method for manufacturing a semiconductor device according to claim 10, wherein an angle formed by a side surface of the grooves and a surface of the semiconductor substrate is set at 60° or less.

12. The method for manufacturing a semiconductor device according to claim 10, wherein as the second barrier film, one kind selected from a group consisting of an aluminum oxide film, a titanium oxide film, a tantalum oxide film, a zirconium oxide film, an aluminum nitride film, a tantalum nitride film and an aluminum oxynitride film is formed.

13. The method for manufacturing a semiconductor device according to claim 10, wherein a thickness of each of the first and second barrier films is made 1 nm to 100 nm.

14. A method for manufacturing a semiconductor device, comprising:
forming a plurality of ferroelectric capacitors over a semiconductor substrate, each of the ferroelectric capacitors comprising a bottom electrode, a ferroelectric film, and a top electrode;
forming a first barrier film directly covering side surfaces of the bottom electrode, the ferroelectric film, and the top electrode of the ferroelectric capacitor and preventing diffusion of hydrogen or water;
forming an interlayer insulating film over the first barrier film; and
forming a wiring connected to the ferroelectric capacitor over the interlayer insulating film,
wherein forming the interlayer insulating film includes forming one or more second barrier films covering at least one of the plurality of ferroelectric capacitors from above and a side and preventing diffusion of hydrogen or water, and thereby causing the one or more second barrier films to cover the plurality of ferroelectric capacitors in common,
wherein the wiring is formed in a plurality of wiring layers, and
wherein the method further includes forming a third barrier film which prevents diffusion of hydrogen or water in a position at a height of one or more of the wiring layers, forming an insulating film on an uppermost wiring layer located at an uppermost position of the plurality of wiring layers, and forming a pad opening reaching the uppermost wiring layer in the insulating film.

15. The method for manufacturing a semiconductor device according to claim 14, wherein the second barrier film is formed from a film selected from a group consisting of an aluminum oxide film, a titanium oxide film, a tantalum oxide film, a zirconium oxide film, an aluminum nitride film, a tantalum nitride film and an aluminum oxynitride film.

16. The method for manufacturing a semiconductor device according to claim 14, wherein a thickness of each of the first and second barrier films is made 1 nm to 100 nm.

* * * * *